US006970372B1

(12) United States Patent
Furukawa et al.

(10) Patent No.: US 6,970,372 B1
(45) Date of Patent: Nov. 29, 2005

(54) DUAL GATED FINFET GAIN CELL

(75) Inventors: Toshiharu Furukawa, Essex Junction, VT (US); Mark Charles Hakey, Fairfax, VT (US); David Vaclav Horak, Essex Junction, VT (US); Charles William Koburger, III, Delmar, NY (US); Mark Eliot Masters, Essex Junction, VT (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/879,833

(22) Filed: Jun. 29, 2004

(51) Int. Cl.[7] .................................................. G11C 7/00
(52) U.S. Cl. ......................................... 365/149; 365/63
(58) Field of Search ................................ 365/149, 187, 365/63; 257/202, 365, 366

(56) References Cited

U.S. PATENT DOCUMENTS 5,580,335 A * 12/1996 Smith, IV .................... 482/44
6,246,083 B1 * 6/2001 Noble ........................ 257/296
6,765,303 B1 * 7/2004 Krivokapic et al. .......... 257/25
6,888,187 B2 * 5/2005 Brown et al. ............... 257/297

* cited by examiner

*Primary Examiner*—Vu A. Le
(74) *Attorney, Agent, or Firm*—Wood, Herron & Evans, LLP

(57) ABSTRACT

A memory gain cell for a memory circuit, a memory circuit formed from multiple memory gain cells, and methods of fabricating such memory gain cells and memory circuits. The memory gain cell includes a storage device capable of holding a stored electrical charge, a write device, and a read device. The read device includes a fin of semiconducting material, electrically-isolated first and second gate electrodes flanking the fin, and a source and drain formed in the fin adjacent to the first and the second gate electrodes. The first gate electrode is electrically coupled with the storage device. The first and second gate electrodes are operative for gating a region of the fin defined between the source and the drain to thereby regulate a current flowing from the source to the drain. When gated, the magnitude of the current is dependent upon the electrical charge stored by the storage device.

18 Claims, 31 Drawing Sheets

DUAL GATED FINFET GAIN CELL

FIELD OF THE INVENTION

The invention relates generally to semiconductor structures and devices and to a method for their fabrication and, more particularly, to memory gain cells and memory circuits and methods for fabricating such memory gain cells.

BACKGROUND OF THE INVENTION

Random access memory (RAM) devices permit execution of both read and write operations on memory cells to manipulate and access stored binary data or binary operating states. Exemplary RAM devices include dynamic random access memory (DRAM) and static random access memory (SRAM). Typically, a high binary operating state (i.e., high logic level) is approximately equal to the power supply voltage and a low binary operating state (i.e., a low logic level) is approximately equal to a reference voltage, usually ground potential. SRAM memory cells are designed to hold a stored binary operating state until the held value is overwritten by a new value or until power is lost. In contrast, DRAM memory cells lose a stored binary operating state unless periodically refreshed every few milliseconds by sensing the held value and writing that held value back to the DRAM cell thereby restoring the DRAM memory cell to its original state. Memory circuits composed of DRAM memory cells are favored in many applications, despite this limitation, over memory circuits based upon SRAM memory cells because of the significantly greater attainable cell densities and low power required.

The area required for each SRAM memory cell contributes to determining the data storage capacity of an SRAM memory circuit. This area is a function of the number of elements constituting each memory cell and the feature size of each element. Conventional SRAM memory cells consist of four to six transistors having four cross-coupled transistors or two transistors and two resistors, as well as two cell-access transistors. A DRAM memory cell may be fabricated with a single capacitor for holding a charge and a single transistor for accessing the held value stored as charge in the capacitor, in contrast to the numerous transistors required for each SRAM memory cell. Absolute SRAM cell size can be improved with reductions in feature size arising from advances in lithography technology. However, further reductions in SRAM cell size may require more radical changes to the basic cell configuration. Despite their advantages over DRAM cells, conventional SRAM cells are expensive to produce and consume large areas on the substrate surface, which limits cell density.

The operation of a gain cell contrasts with the operation of both SRAM cells and DRAM cells. In a conventional gain cell, charge held by a storage capacitor operates as a gate that regulates current sensed over sense source and sense drain lines by remote access circuitry. Similar to a DRAM cell, the held values of a gain cell must be periodically refreshed. Although gain cells are less compact than DRAM cells, gain cells operate faster than DRAM cells. Although gain cells operate slower than SRAM cells, gain cells are more compact than SRAM cells. Therefore, gain cells are suitable candidates for applications such as on-chip cache memories.

What is needed, therefore, is a memory circuit in which each gain cell consumes less area per cell than conventional SRAM cells, incorporates a storage capacitor as a storage device, and features simplified access requirements.

SUMMARY OF THE INVENTION

In accordance with the principles of the invention, a memory gain cell includes a storage device capable of holding a stored electrical charge, a write device, and a read device. The read device includes a fin of a semiconducting material, a first gate electrode and a second gate electrode flanking the fin and electrically isolated from the fin by a gate dielectric, and a source and drain formed in the fin adjacent to the first and the second gate electrodes. The first gate electrode is electrically coupled with the storage device. The first and second gate electrodes are operative for gating a region of the fin defined between the source and the drain to thereby regulate a current flowing from the source to the drain. The current, when the region of the fin is gated during a read operation, is dependent upon the electrical charge stored by the storage device. The write device, which is electrically coupled with the storage device, is adapted to charge and discharge the storage device to define the stored electrical charge.

In another aspect of the invention, a method of fabricating a structure for a gain cell comprises forming a first gate electrode and a second gate electrode flanking a fin defined in an active layer of a semiconducting material and forming first and second source/drain regions in the fin adjacent to the first and the second gate electrodes. The method further includes forming first and second capacitor plates arranged in a generally vertical relationship with the fin and the first gate electrode, in which the first capacitor plate is electrically coupled with the first gate electrode. The first and second capacitor plates are electrically isolated from one another. The method may further comprise forming a write device coupled with the first capacitor plate for charging and discharging the first plate to define a stored electrical charge.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

FIGS. 2A–16A and 2B–16B are views similar to FIGS. 1A and 1B, respectively, at subsequent fabrication stages in accordance with an embodiment of the invention.

FIGS. 17A–31A and 17B–31B are views similar to FIGS. 1A and 1B, respectively, at subsequent fabrication stages in accordance with an alternative embodiment of the invention.

DETAILED DESCRIPTION

Figure 1A:
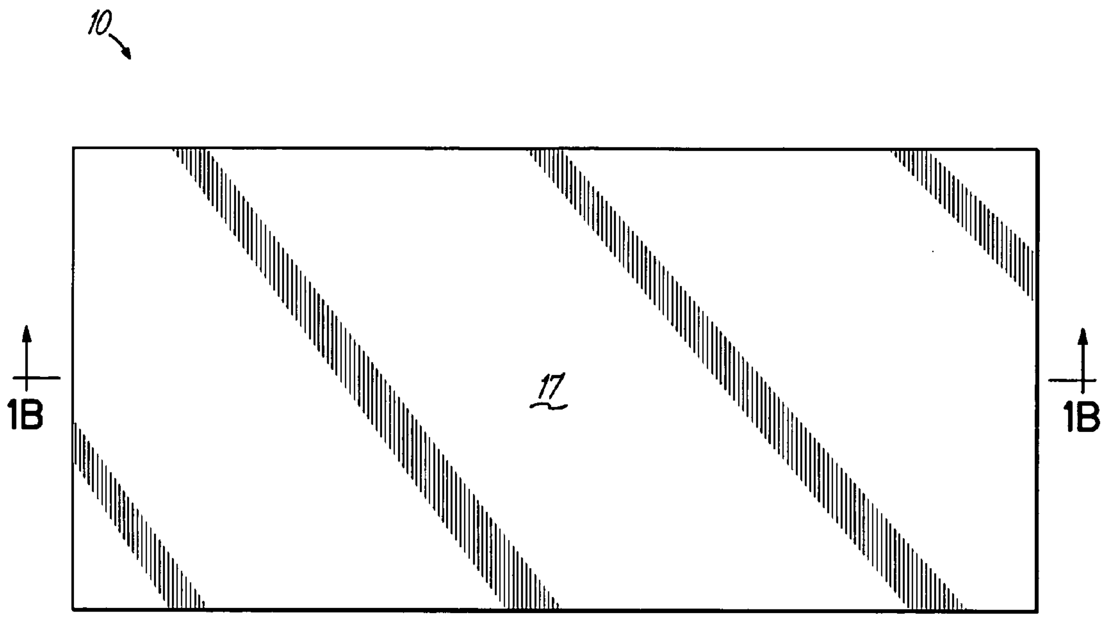
FIG. 1A is a diagrammatic top view of a portion of a substrate.
Figure 1B:
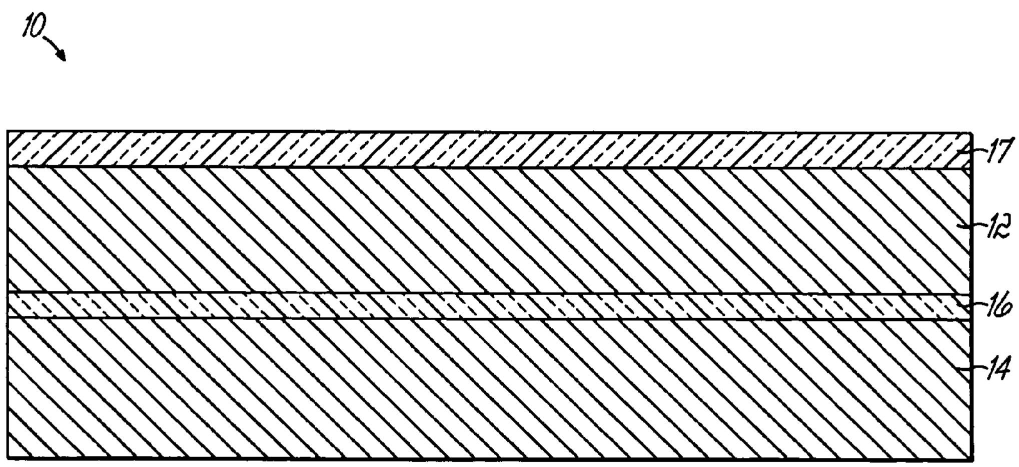
FIG. 1B is a cross-sectional view taken generally along lines 1B—1B of FIG. 1A.

With reference to FIGS. 1A and 1B, a semiconductor-on-insulator (SOI) substrate, generally indicated by reference numeral 10, includes an active layer 12 of silicon, or another suitable semiconductor material, separated vertically from a handle wafer 14 by an insulating layer 16 (e.g., a buried oxide). Insulating layer 16 electrically isolates the active layer 12 from the handle wafer 14, which is typically silicon. The SOI substrate 10 may be fabricated by any standard technique, such as wafer bonding or a separation by implantation of oxygen (SIMOX) technique. In the illustrated embodiment of the invention, the silicon constituting the active layer 12 may be doped initially with an n-type dopant to render it n-type or a p-type dopant to render it p-type. The handle wafer 14 may be formed from any suitable semiconductor material including, but not limited to, silicon and polycrystalline silicon (polysilicon). The dielectric material constituting insulating layer 16 is typically silicon dioxide ($SiO_2$) having a thickness in the range of about fifty (50) nanometers to about 150 nanometers, but is not so limited. The active layer 12 may be as thin as about ten (10) nanometers or less and, typically, is in the range of about twenty (20) nanometers to about 150 nanometers. The thickness of the handle wafer 14 is not shown to scale in FIG. 1B.

Active layer 12 is capped with a layer 17 of a hard mask material, such as a pad nitride, in order to provide a self-aligned upper oxidation barrier and polish stop that allows the use of aggressive dry etching processes such as plasma etching. To that end, a conformal blanket of the hard mask material, which may be ten (10) nanometers to 150 nanometers of silicon nitride ($Si_3N_4$), is applied over the active layer 12. Although not shown, isolation regions of an appropriate dielectric material, such as $SiO_2$, surround the portion of the active layer 12 visible in FIGS. 1A and 1B.

References herein to terms such as "vertical", "horizontal", etc. are made by way of example, and not by way of limitation, to establish a frame of reference. The term "horizontal" as used herein is defined as a plane parallel to the conventional plane or surface of SOI substrate 10, regardless of orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood various other frames of reference may be employed without departing from the spirit and scope of the invention.

Figure 2A:
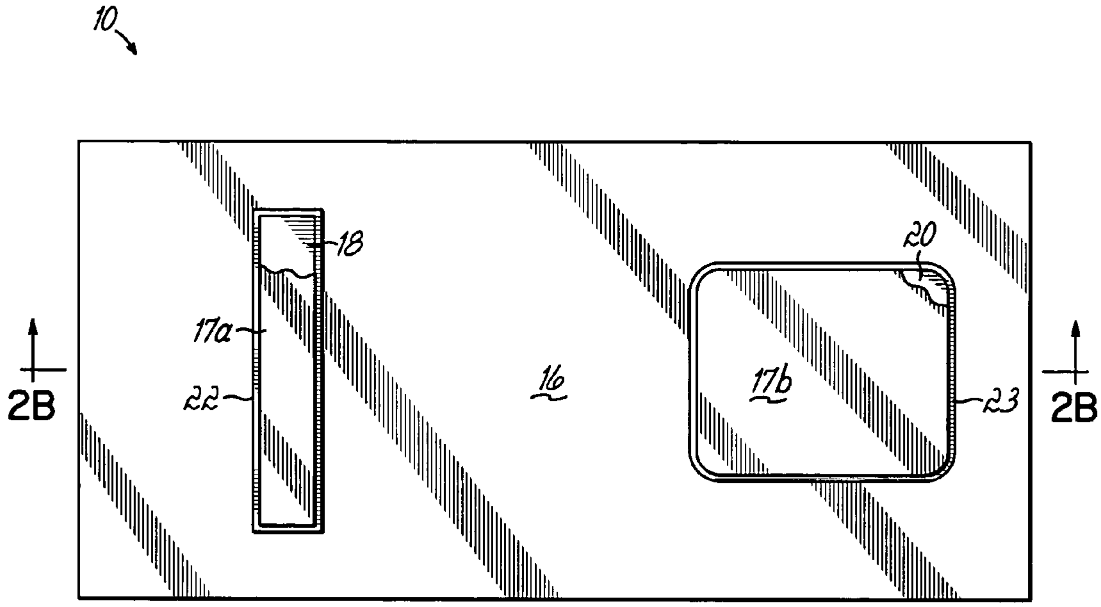
Figure 2B:
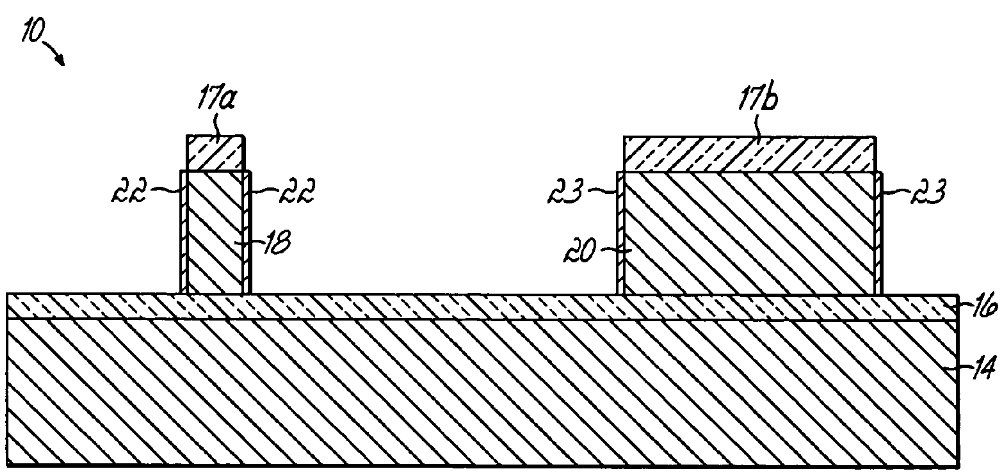
Figure 10A:
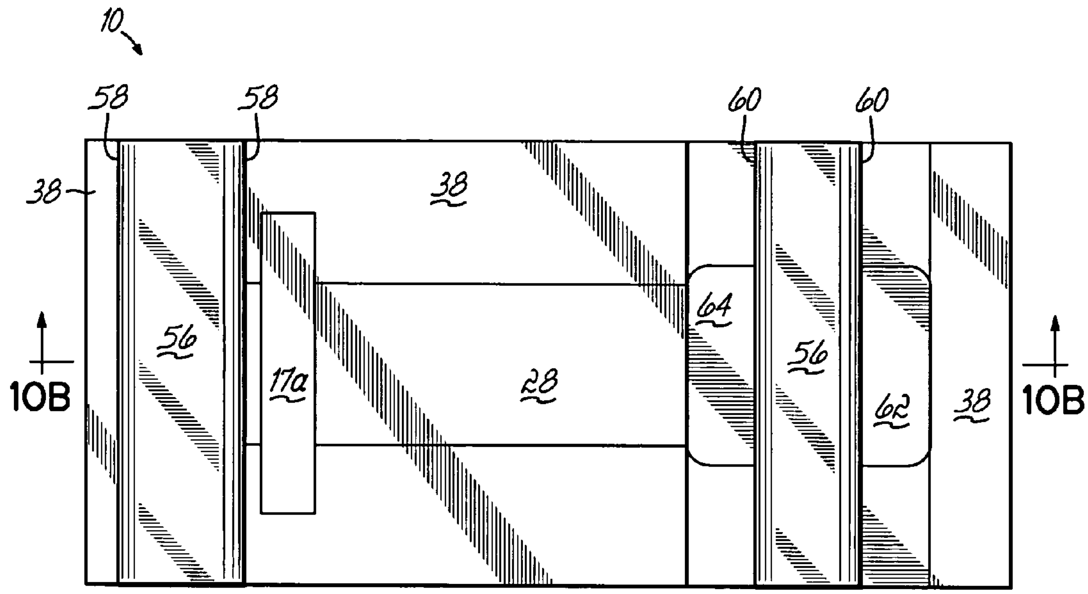
Figure 10B:
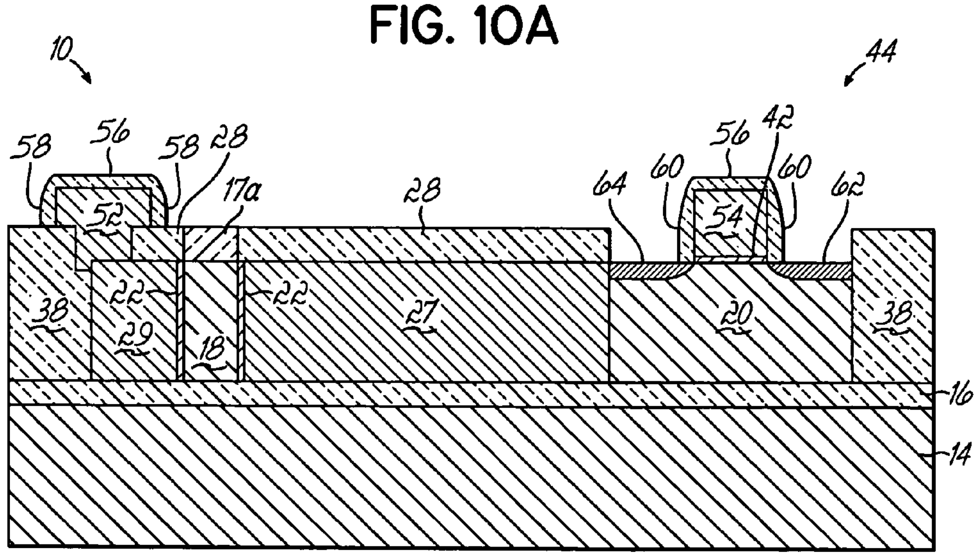

With reference to FIGS. 2A and 2B in which like features refer to like reference numerals in FIGS. 1A and 1B and at a subsequent fabrication stage, active layer 12 and layer 17 are patterned by a standard lithography and etch process to define a silicon fin 18 for building a read device 37 (FIGS. 6A and 6B) and a silicon body 20 from active layer 12 to be used as a substrate for building a write device 44 (FIGS. 10A and 10B). Silicon fin 18 and silicon body 20 are covered by capping layers 17*a*, 17*b*, respectively, which represent the remnants of layer 17. The chemistry of the etch process is selected to stop at the horizontal plane of the insulating layer 16. A gate dielectric 22 is formed on the vertical sidewall of the silicon fin 18. Gate dielectric 22 may comprise an oxide (i.e., $SiO_2$) grown from either a dry oxygen ambient or steam or a deposited layer of $SiO_2$. Alternatively, the gate dielectric 22 may be formed from any of the many candidate high dielectric constant (high-k) materials, including but not limited to $Si_3N_4$, silicon oxynitride ($SiO_xN_y$), a gate dielectric stack of $SiO_2$ and $Si_3N_4$, and metal oxides like $Ta_2O_5$, as recognized by persons of ordinary skill in the art. A dielectric layer 23 may also be applied by the process forming gate dielectric 22 to the vertical sidewall of silicon body 20.

Figure 3A:
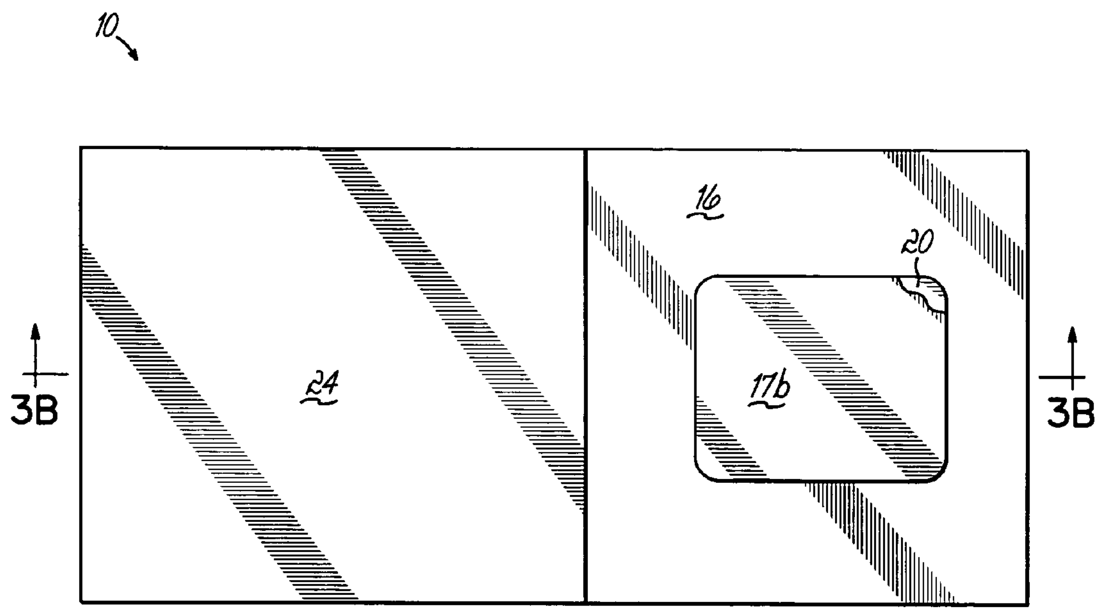
Figure 3B:
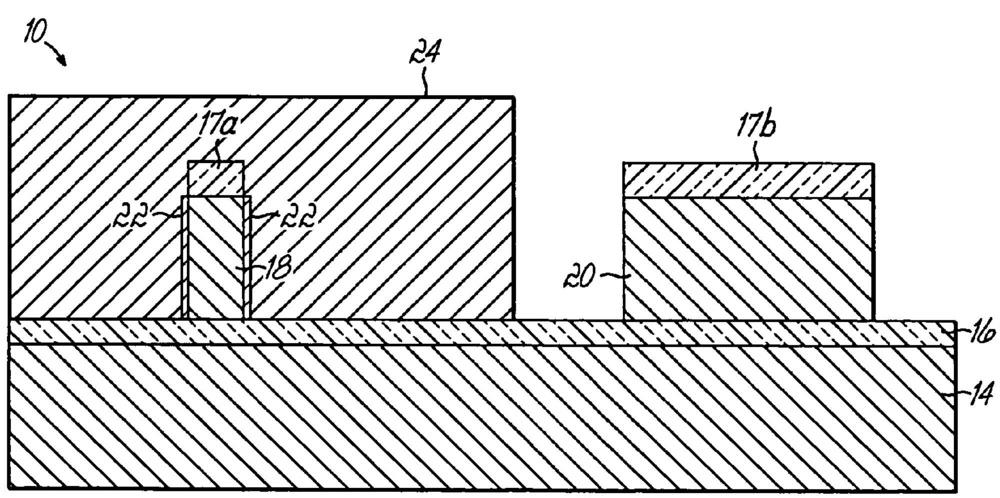

With reference to FIGS. 3A and 3B in which like features refer to like reference numerals in FIGS. 2A and 2B and at a subsequent fabrication stage, the silicon fin 18 is masked by a resist layer 24. An etch process is used to remove any dielectric layer 23 (FIGS. 2A and 2B) formed as an artifact of the process forming gate dielectric 22.

Figure 4A:
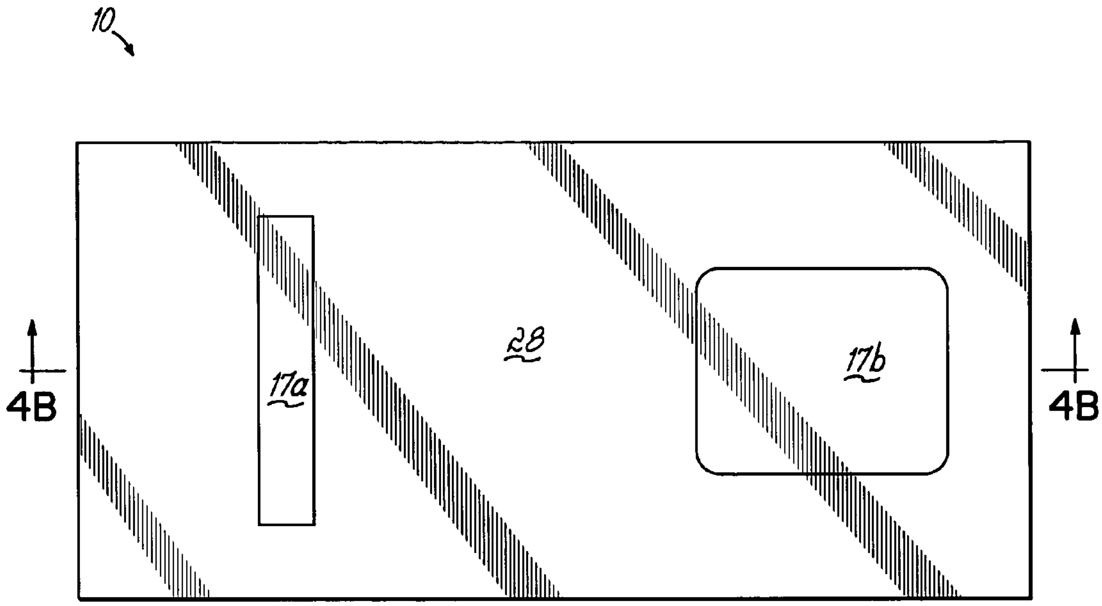
Figure 4B:
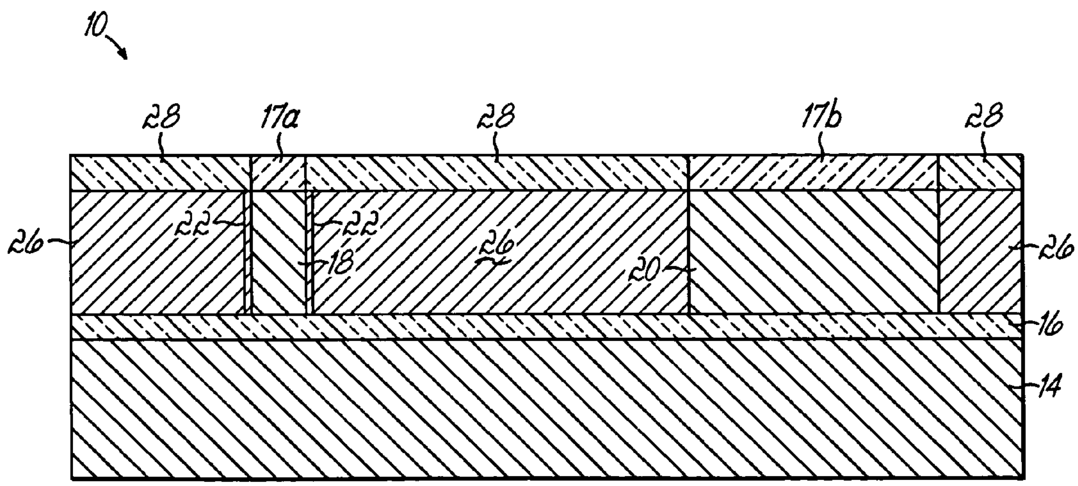

With reference to FIGS. 4A and 4B in which like features refer to like reference numerals in FIGS. 3A and 3B and at a subsequent fabrication stage, the resist layer 24 is stripped following the completion of the etch process removing dielectric layer 23 (FIGS. 2A and 2B). A gate conductor layer 26 is deposited for filling the trenches surrounding silicon fin 18 and silicon body 20 and other trenches between adjacent silicon fins and regions (not shown). Gate conductor layer 26 may be any suitable conducting material including, but not limited, to polysilicon, amorphous silicon, a combination of amorphous silicon and polysilicon, and polysilicon-germanium, deposited as a doped layer. In certain alternative embodiments of the invention, the gate conductor layer 26 may be formed from one or more metals, such as tungsten, titanium, tantalum, molybdenum, or nickel, a metal silicide, or a metal nitride, deposited using physical vapor deposition, chemical vapor deposition, or any other technique known in the art.

Layer 26 is polished and recessed vertically employing an anisotropic etch process. The recessed layer 26 is covered by a layer 28 of an appropriate dielectric material, such as $SiO_2$, conformally deposited by chemical vapor deposition (CVD). Layer 28 is polished flat and planarized by chemical-mechanical polishing (CMP) or any other suitable planarization technique relying on the upper horizontal surface of capping layers 17*a,b* as a polish stop.

Figure 5A:
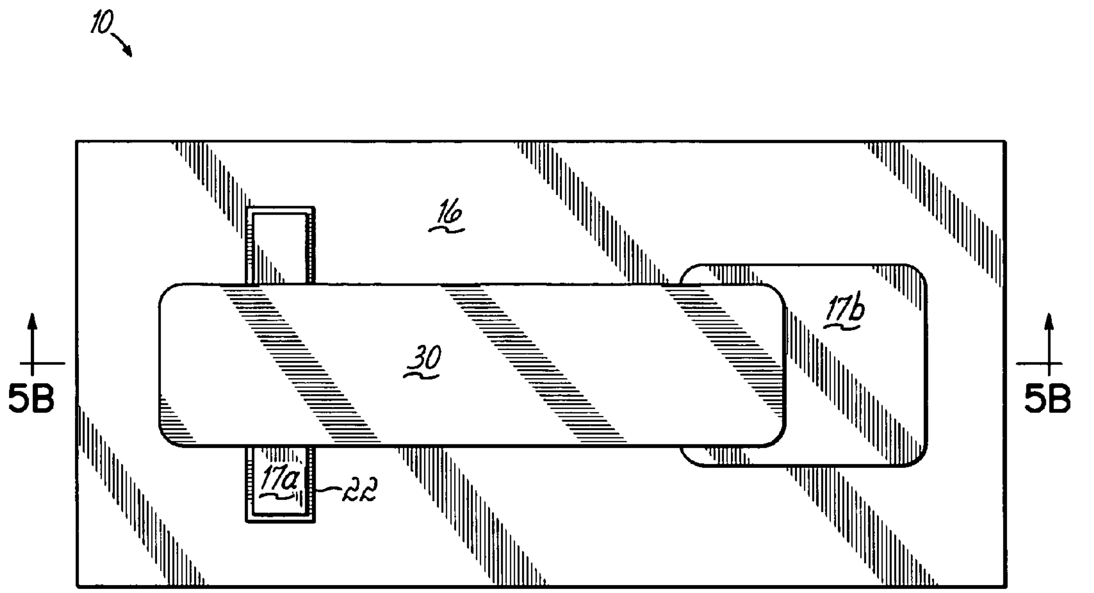
Figure 5B:
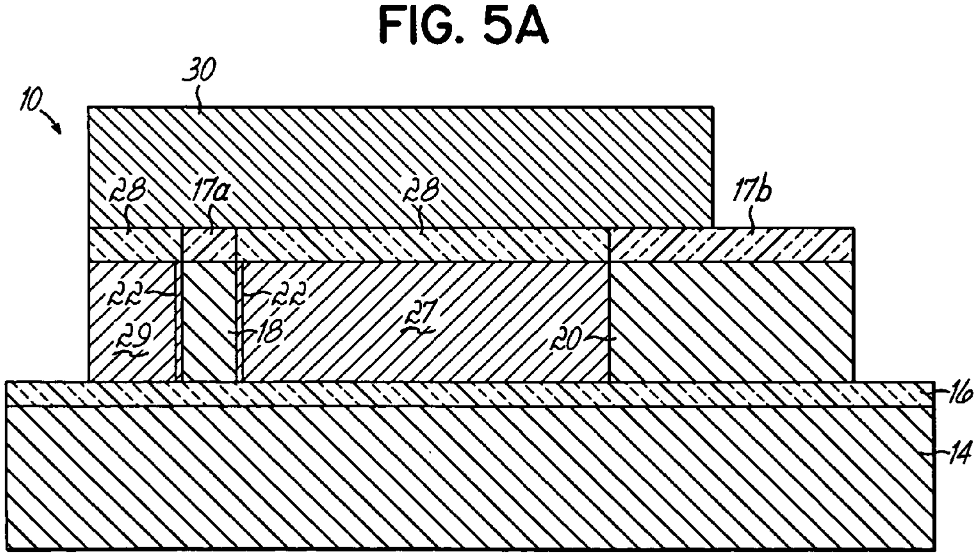

With reference to FIGS. 5A and 5B in which like features refer to like reference numerals in FIGS. 4A and 4B and at a subsequent fabrication stage, a patterned resist layer 30 is formed by a conventional process. An etch process selective to the resist layer 30 and the material forming capping layers 17*b*, which collectively define masked areas, is used to selectively remove layers 26 and 28 in unmasked areas and thereby transfer features in the patterned resist layer 30. Insulating layer 16 operates as an etch stop for the etch process, which is also selective to layer 16. As is known to those skilled in the art, an etch stop is an intervening layer designed to prevent an etchant from proceeding to an underlying or overlaying layer. The etch stop is characterized by a significantly greater etch resistance to a selected etch process than the adjacent layer or layers that are to be removed by the etch process. The residual portion of gate conductor layer 26 defines gate electrodes 27 and 29 formed adjacent to gate dielectric 22 and abutting opposing vertical sidewalls of the silicon fin 18. The gate dielectric 22 electrically isolates the gate electrodes 27 and 29 from the silicon fin 18.

Figure 6A:
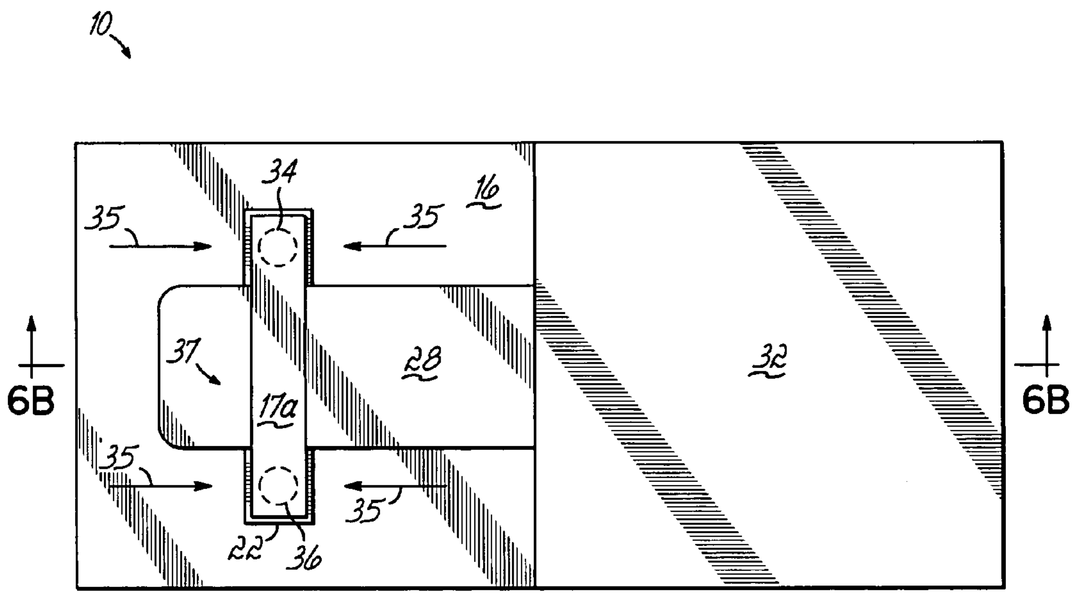
Figure 6B:
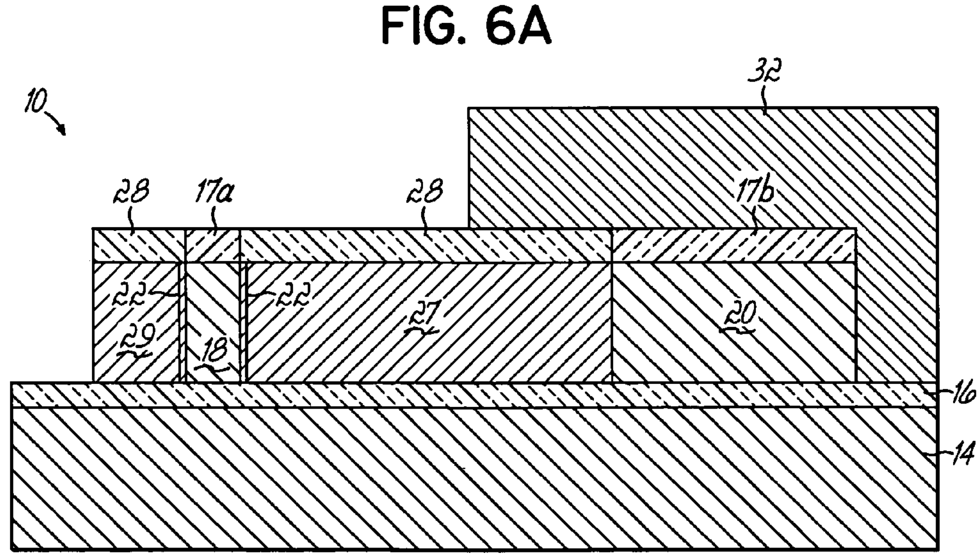

With reference to FIGS. 6A and 6B in which like features refer to like reference numerals in FIGS. 5A and 5B and at a subsequent fabrication stage, resist layer 30 is stripped and another patterned resist layer 32 is applied generally over silicon body 20 and surrounding portions of insulating layer 16. Source/drain regions 34 and 36 are defined in the opposite ends of silicon fin 18 by doping with impurities, such as n-type or p-type impurities. Definition of the source/drain regions 34 and 36 may be accomplished using any of the variety of methods that have been developed to form source/drain regions 34, 36 and that are tailored for specific performance requirements. For example, the source/drain regions 34 and 36 may be formed by tilted ion implantation, indicated diagrammatically by arrows 35 in FIG. 6A, that implants an ion dose, typically on the order of about $5\times10^{14}$ atoms/$cm^2$ or greater, of a suitable n-type or p-type impurity with an implant energy of 1 keV to 100 keV in opposite end regions of silicon fin 18 not masked by layer 28 and gate electrodes 27 and 29 and through the gate dielectric 22. Resist layer 32 operates as an implant mask for silicon body 20. Source/drain regions 34 and 36 each have a junction self-aligned to one of opposite side edges of gate electrodes 27 and 29, respectively. As used herein, the phrase "source/drain region" describes a region that may serve as either a source or a drain depending upon whether connected to source voltage or drain voltage.

Figure 16A:
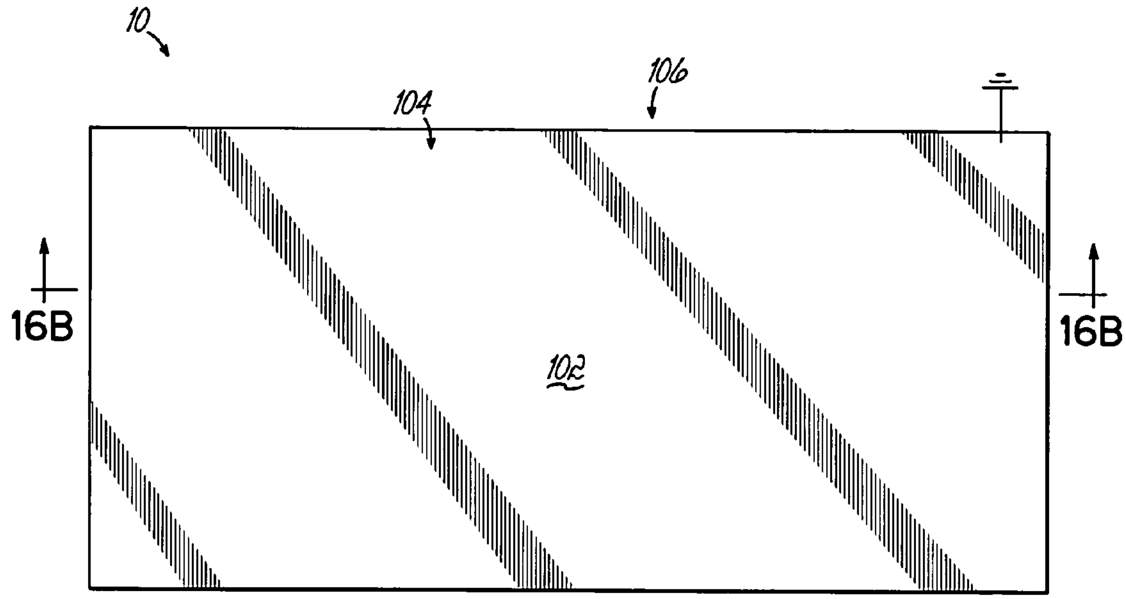
Figure 16B:
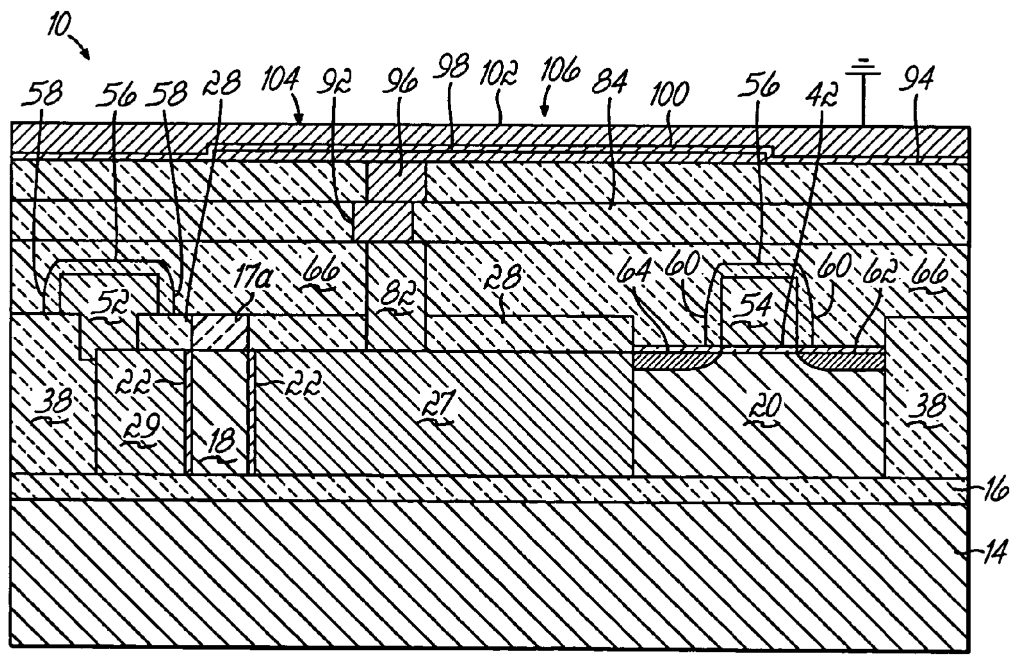

A portion of the silicon fin 18 located between the source/drain regions 34 and 36, which is shielded during the implantation, defines a channel that has a resistivity regulated by voltage applied to the gate electrodes 27 and 29 and capacitively coupled through gate dielectric 22. This dual-gated fin field effect transistor (FinFET) structure defines a read device, generally indicated by reference numeral 37, for the memory gain cell 106 (FIGS. 16A and 16B). The FinFET read device 37 has small channel dimensions without the typical short channel effects, such as excessive off-state leakage between the source and drain, often associated with conventional planar metal-oxide-semiconductor FET's (MOSFET's) of these dimensions.

Figure 7A:
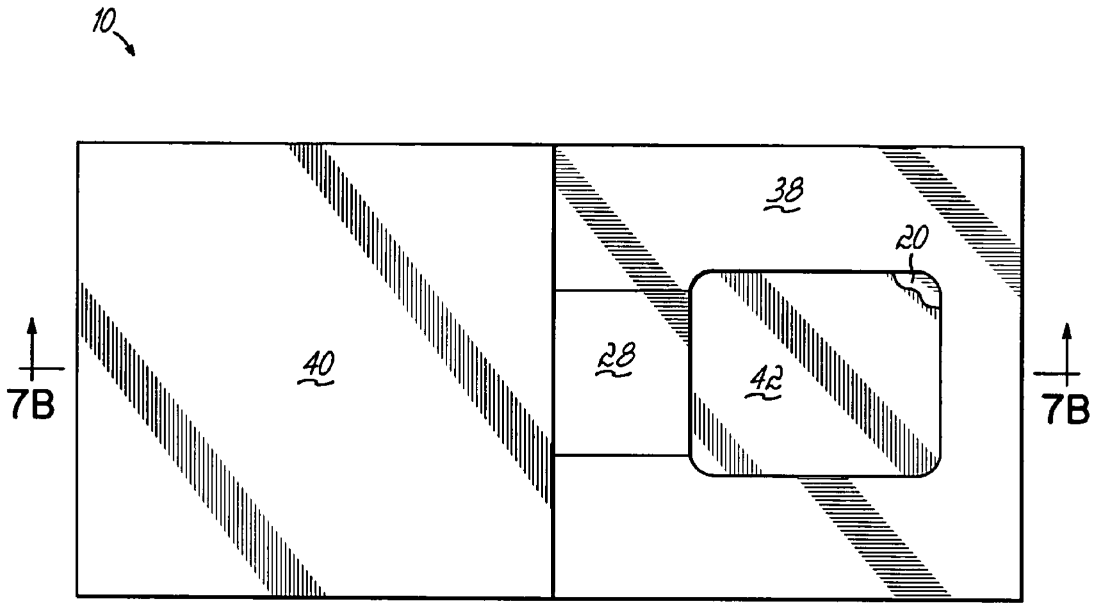
Figure 7B:
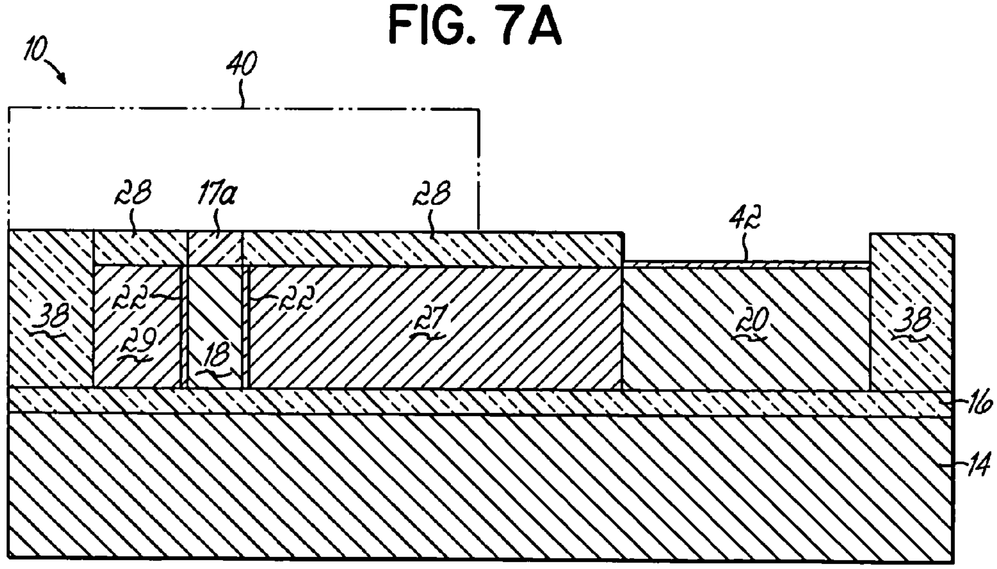

With reference to FIGS. 7A and 7B in which like features refer to like reference numerals in FIGS. 6A and 6B and at a subsequent fabrication stage, resist layer 32 is stripped and an insulating layer 38 is conformally deposited on substrate 12. Insulating layer 38 is polished flat and planarized by a planarization technique, such as CMP, relying on the upper horizontal surface of capping layers 17*a* and 17*b* as a polish stop. Insulating layer 38 may be, for example, $SiO_2$ deposited by CVD using tetraethylorthosilicate (TEOS) as the silicon precursor source. Generally, the TEOS-$SiO_2$ film is understood to be a non-stoichiometric oxide of silicon, although it is commonly referred to as silicon dioxide. A patterned resist layer 40 is applied generally over silicon fin 18 and surrounding portions of insulating layer 38. Capping layer 17*b* is removed from silicon body 20 by a dry etch process selective to the material of insulating layer 38. The resist layer 40 is stripped and a gate dielectric 42 is formed atop silicon body 20. Gate dielectric 42 may comprise an oxide (i.e., $SiO_2$) grown from either a dry oxygen ambient or steam. The thickness of gate dielectric 42 may vary depending upon the required performance of the write device 44 (FIGS. 10A and 10B) being formed.

Figure 8A:
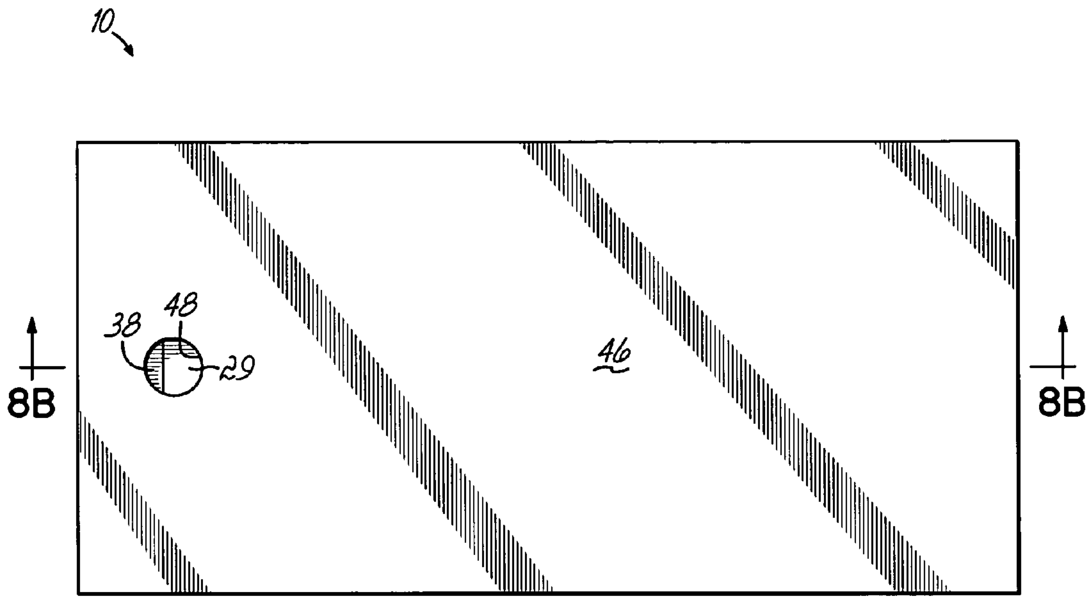
Figure 8B:
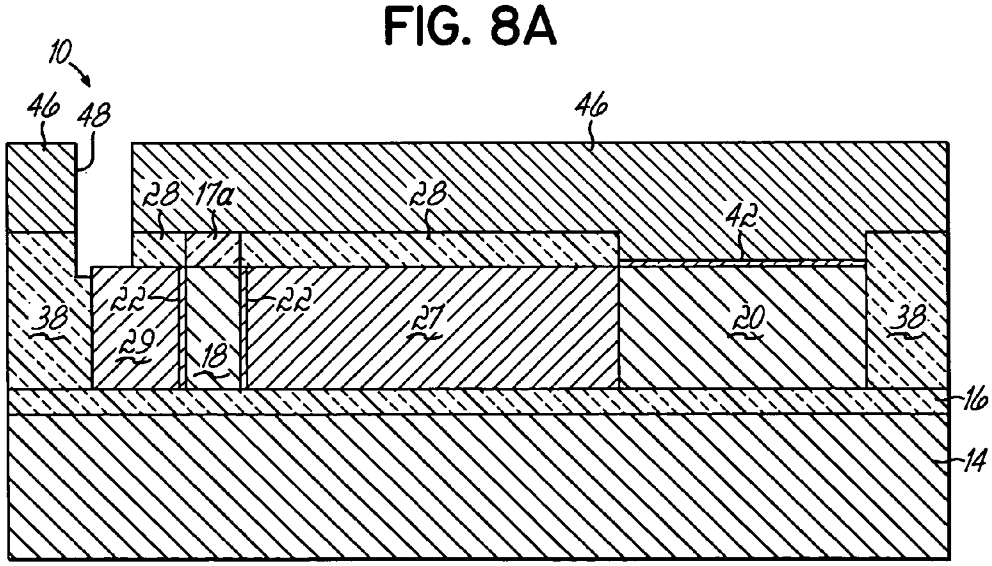

With reference to FIGS. 8A and 8B in which like features refer to like reference numerals in FIGS. 7A and 7B and at a subsequent fabrication stage, a patterned resist layer 46 is formed across the substrate 10. A contact opening 48 is formed by an anisotropic dry etch process that removes the material of insulating layers 28 and 38 selective to the material constituting gate electrode 29.

Figure 9A:
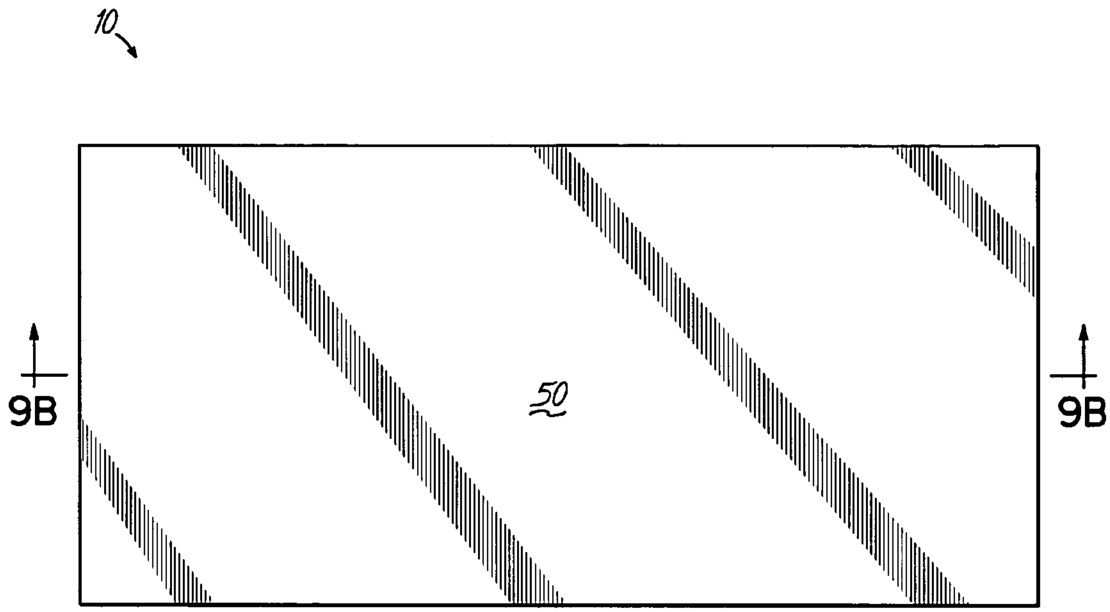
Figure 9B:
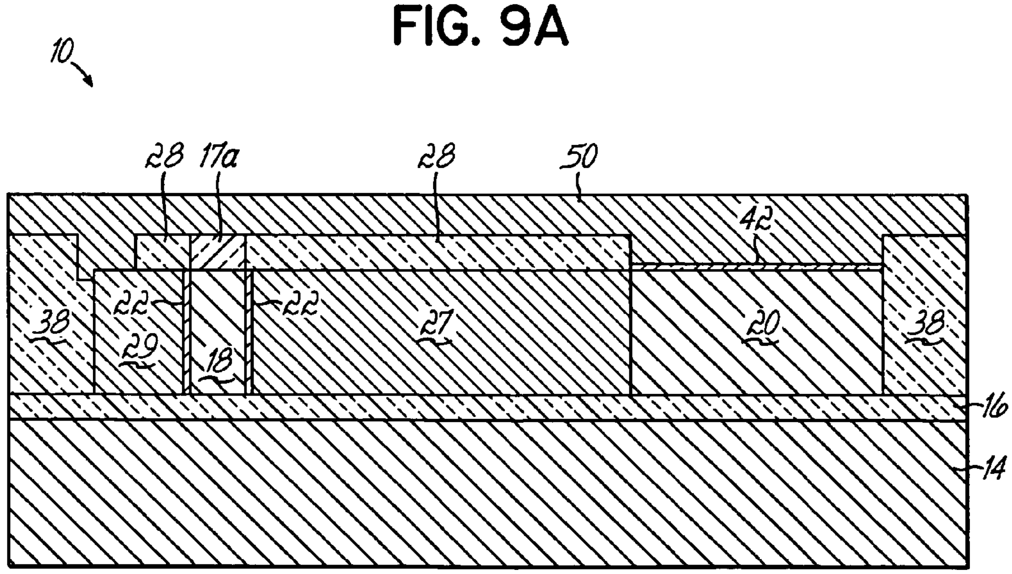

With reference to FIGS. 9A and 9B in which like features refer to like reference numerals in FIGS. 8A and 8B and at a subsequent fabrication stage, resist layer 46 is stripped following the completion of the etch process forming contact opening 48. A conductive layer 50 is conformally deposited on substrate 10 that fills the contact opening 48 and fills the space overlying the gate dielectric 42. Conductive layer 50 may be any suitable conducting material including, but not limited to, polysilicon, amorphous silicon, a combination of amorphous silicon and polysilicon, and polysilicon-germanium, deposited as a doped layer. In certain alternative embodiments of the invention, conductive layer 50 may be formed from one or more metals, such as tungsten, titanium, tantalum, molybdenum, or nickel, a metal silicide, or a metal nitride, deposited using physical vapor deposition, chemical vapor deposition, or any other technique known in the art.

With reference to FIGS. 10A and 10B in which like features refer to like reference numerals in FIGS. 9A and 9B and at a subsequent fabrication stage, a read line 52 and a write line 54 are formed. To that end, an optional capping layer 56 of a hard mask material is deposited on the conductive layer 50 and is patterned in conjunction with the conductive layer 50. The conductive layer 50 and the capping layer 56, if present, are patterned by a standard lithography and etch process to define read line 52 and write line 54 using a patterned layer of resist (not shown) as a template. The length of write line 54 overlying gate dielectric 42 operates as a gate electrode for write device 44 of the depicted exemplary memory gain cell, which is among the many identical gain cells constituting the memory circuit. The write line 54 couples write devices 44 aligned in a column of the memory circuit. Other write lines, similar to and generally parallel with write line 54, couple write devices 44 in other columns of the memory circuit being fabricated.

After the resist is stripped, sidewall spacers 58 and 60 are then formed on the read line 52 and write line 54, respectively, from a material such as $Si_3N_4$, as is familiar to persons of ordinary skill in the art. Write line 54 and sidewall spacer 60 serve as a self-aligned mask for implanting a dopant species to form source/drain regions 62 and 64. The technique of implanting dopant species to form source/drain regions 62 and 64 is familiar to persons of ordinary skill in the art. Briefly, a dopant species suitable for either p-type or n-type source/drain regions 62 and 64 is implanted into silicon body 20 using write line 54 and sidewall spacer 60 as a self-aligned ion implantation mask, followed by a thermal anneal that removes implantation damage and activates the dopant species. Source and drain extensions (not shown) may be formed in the silicon body 20 on opposite sides of write line 54, before the spacer 60 is formed, by a technique known to persons of ordinary skill in the art. A portion of silicon body 20 defined between the source/drain regions 62 and 64 comprises a channel having a resistivity that is controlled by voltage supplied from a power supply to the write line 54 and electrostatically coupled to the channel through the gate dielectric 42. Preferably, source/drain region 64 is a drain that is electrically coupled by gate electrode 27 with capacitor 104 (FIGS. 16A and 16B).

Figure 11A:
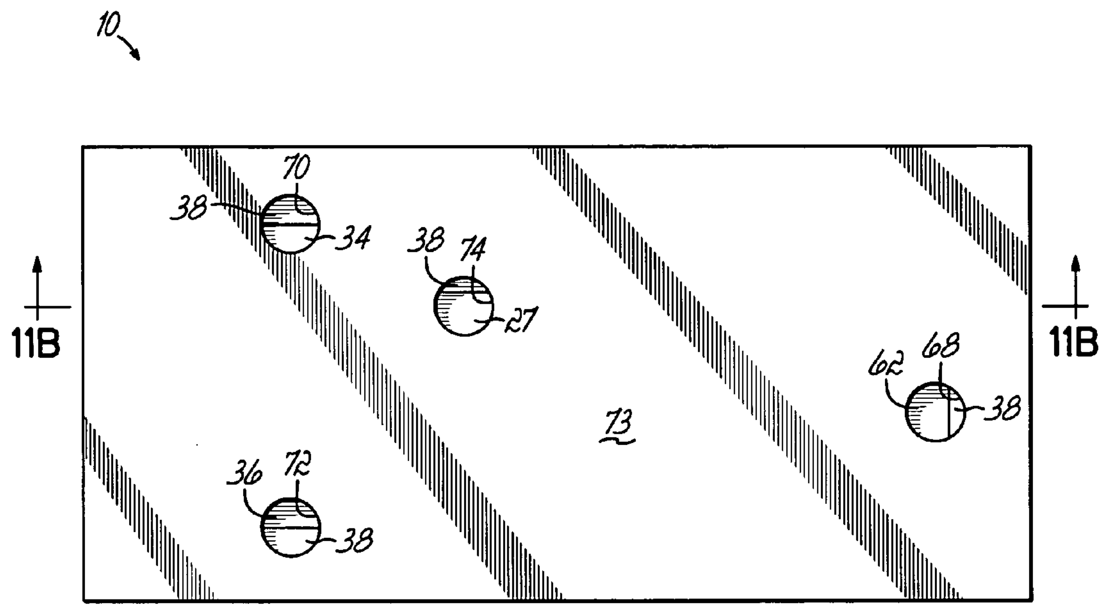
Figure 11B:
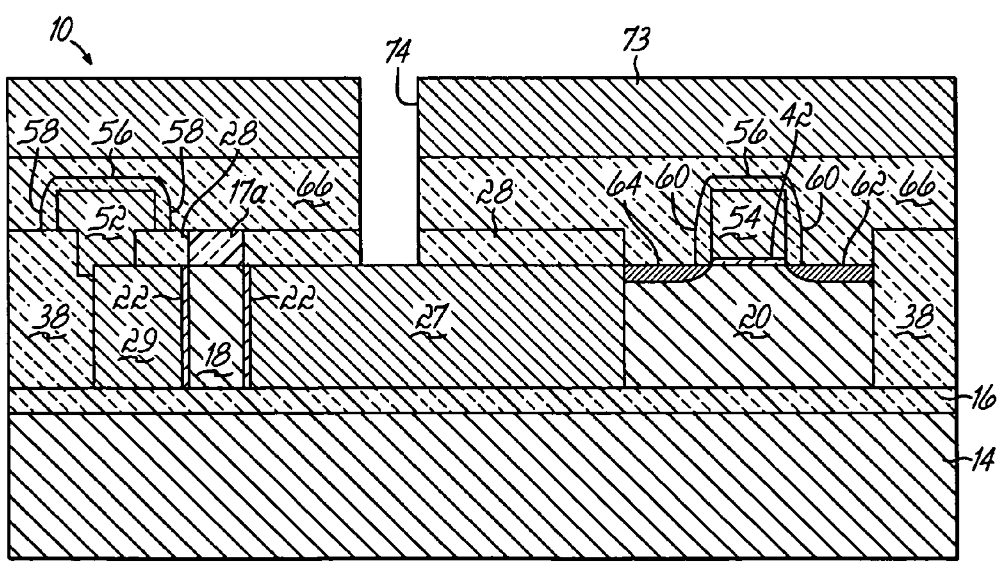

With reference to FIGS. 11A and 11B in which like features refer to like reference numerals in FIGS. 10A and 10B and at a subsequent fabrication stage, a layer 66 of a dielectric, such as TEOS $SiO_2$, is deposited by, for example, CVD across substrate 10 and then polished flat by CMP or any other suitable planarization technique. Contact openings 68, 70 and 72 are structured and etched using a conventional lithography and anisotropic etch process that uses a patterned resist layer 73 as a template. Contact opening 68 extends to depth of and exposes source/drain region 62 of the write device 44. Contact openings 70 and 72 extend through layer 66 and capping layer 17*a* to depth of, and thereby expose, source/drain regions 34 and 36, respectively, of the read device 37. Opening 74, also formed by the etch process forming contact openings 68, 70 and 72 that etches the layers 28 and 66 selective to the material of active layer 12 and gate electrode 27, extends vertically through dielectric layers 28 and 66 to the depth of the gate electrode 27, which operates as an etch stop.

Figure 12A:
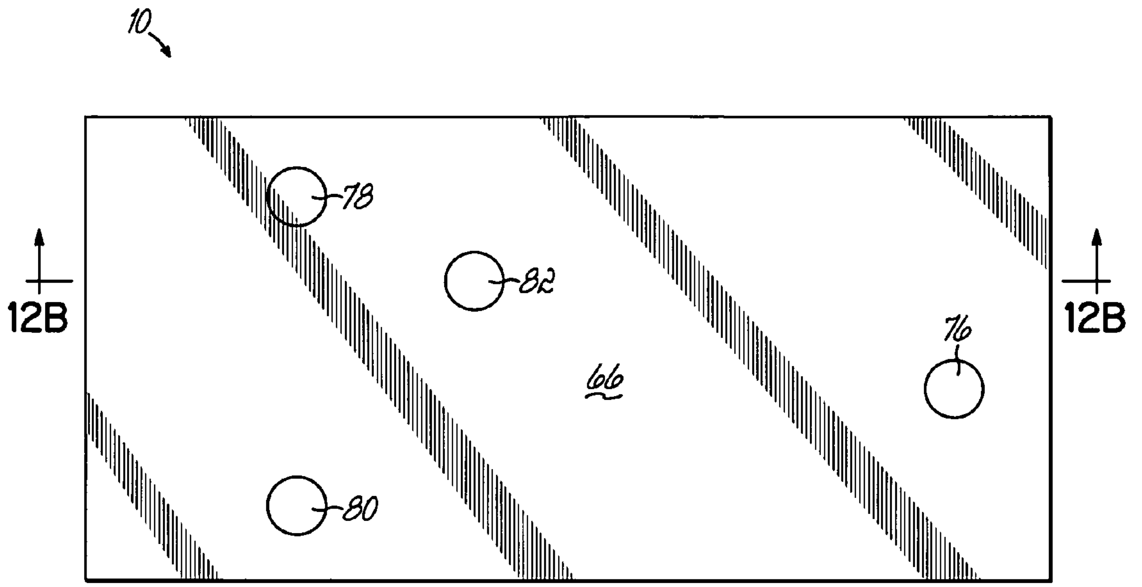
Figure 12B:
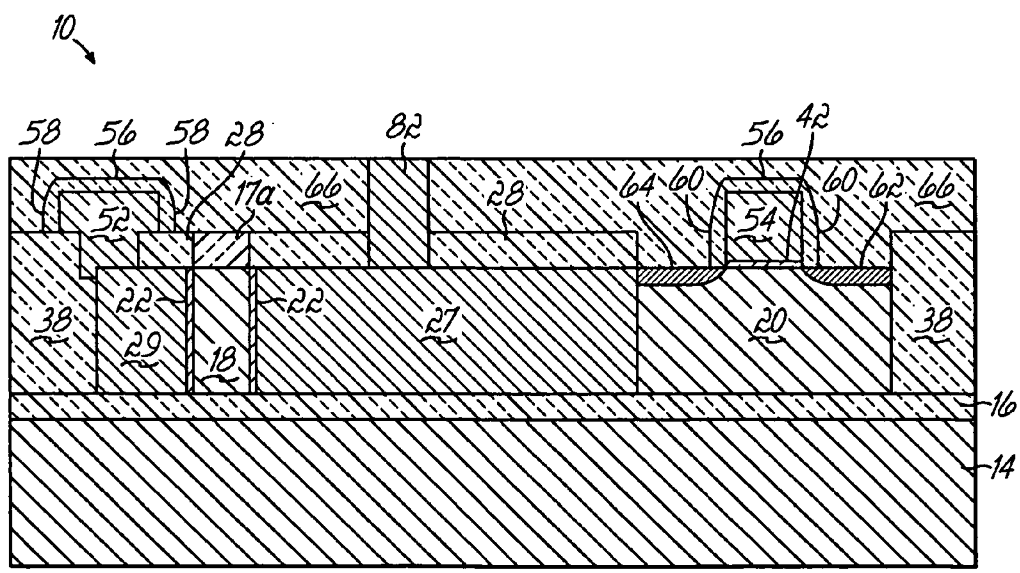

With reference to FIGS. 12A and 12B in which like features refer to like reference numerals in FIGS. 11A and 11B and at a subsequent fabrication stage, openings 68, 70, 72 and 74 are filled by corresponding contacts 76, 78, 80 and 82 of a conducting material to conclude a damascene process flow. Accordingly, a layer of a suitable conducting material, such as doped polysilicon, a silicide, metals (e.g., Au, Al, Mo, W, Ta, Ti, or Cu), or the like, is conformally deposited by evaporation, sputtering, or another known technique and then planarized typically using CMP to remove the excess overburden of the conducting layer from dielectric layer 66.

Figure 13A:
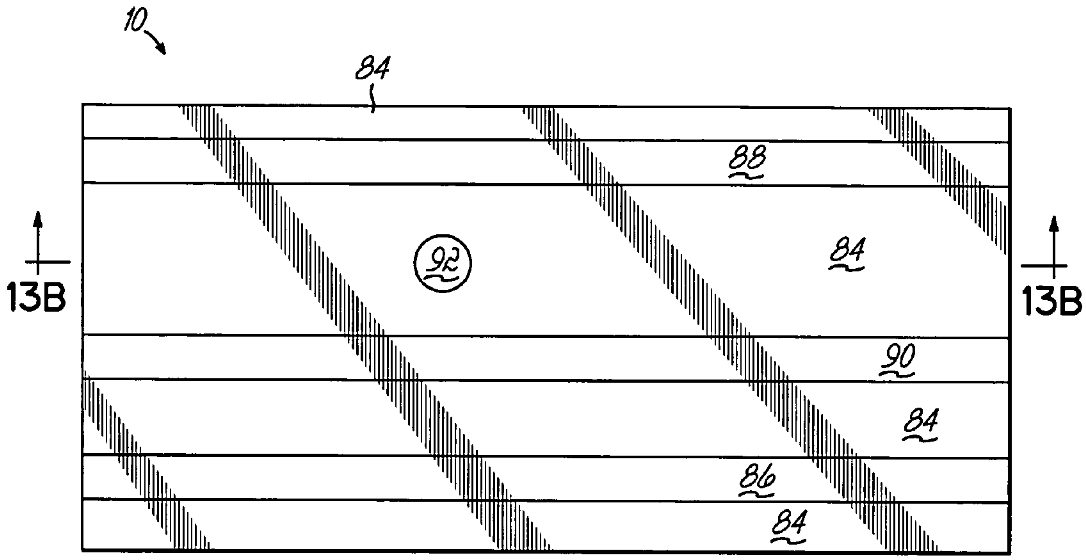
Figure 13B:
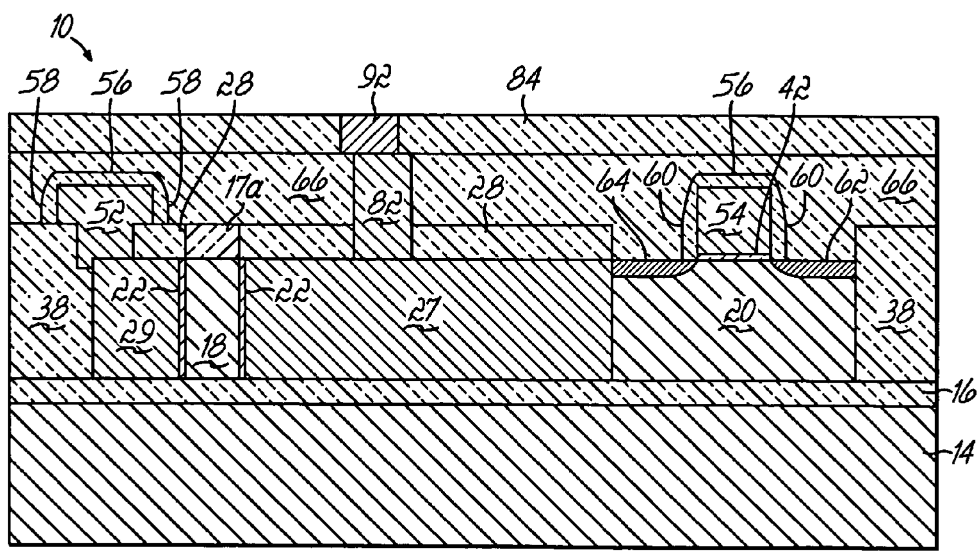

With reference to FIGS. 13A and 13B in which like features refer to like reference numerals in FIGS. 12A and 12B and at a subsequent fabrication stage, another layer 84 of a dielectric, such as TEOS-$SiO_2$, is deposited by, for example, CVD across substrate 10.

A read source line 86, a read drain line 88, a write bitline 90, and a capacitor contact 92 are defined in dielectric layer 84 by a damascene process flow. To that end, dielectric layer 84 is patterned using a conventional lithography and etch process, and a layer of a suitable conducting material, such as doped polysilicon, a silicide, metals (e.g., Au, Al, Mo, W, Ta, Ti, or Cu), or the like, is conformally deposited by evaporation, sputtering, or another known technique and then planarized typically using CMP to remove the excess overburden of the conducting layer from dielectric layer 84. The read source line 86 and read drain line 88 are coupled by contacts 78 and 80 with source/drain regions 34 and 36, respectively, of read device 37 and source/drain regions 34, 36 of the read device 37 of other memory gain cells (not shown). The write bitline 90 is coupled by contact 76 with source/drain region 62 of the write device 44. Additional read source and drain lines and write bitlines (not shown) electrically couple gain cells in other rows of the memory circuit.

Figure 14A:
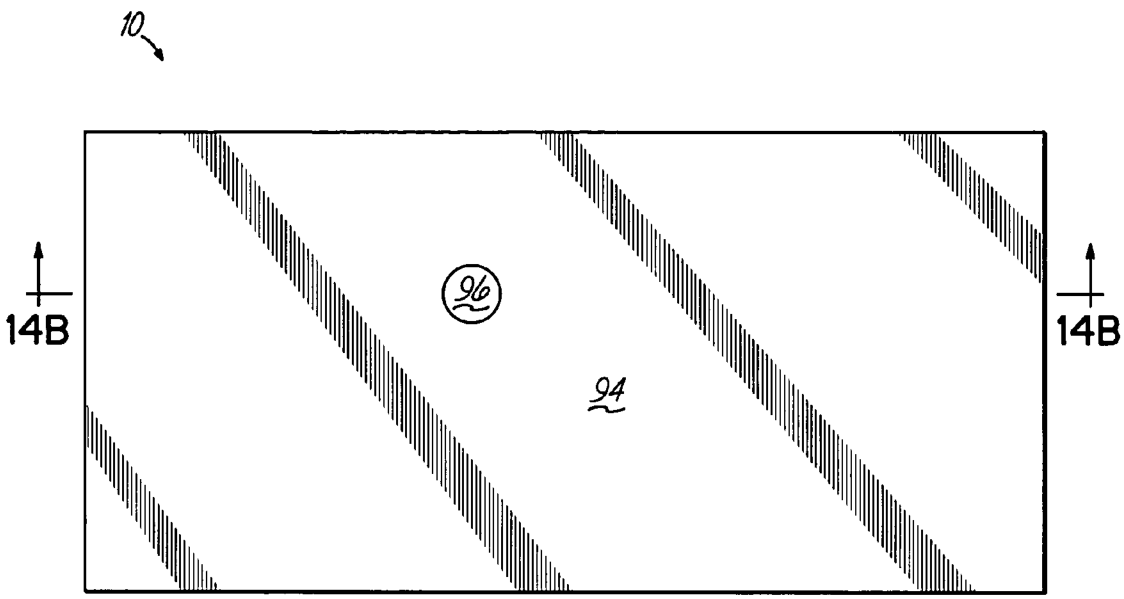
Figure 14B:
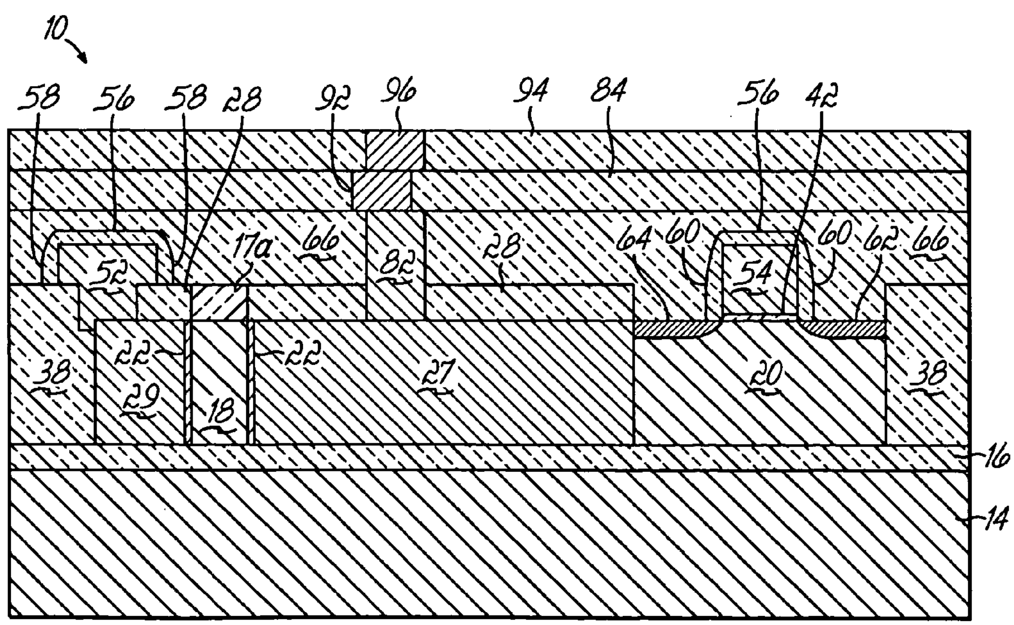

With reference to FIGS. 14A and 14B in which like features refer to like reference numerals in FIGS. 13A and 13B and at a subsequent fabrication stage, another layer 94 of a dielectric, such as TEOS-$SiO_2$, is deposited by, for example, CVD across substrate 10. A capacitor stud 96 is defined in dielectric layer 94 by patterning dielectric layer 94 using a conventional lithography and etch process, conformally depositing a layer of a suitable conducting material, such as doped polysilicon, a silicide, metals (e.g., Au, Al, Mo, W, Ta, Ti, or Cu), or the like, by evaporation, sputtering, or another known technique, and planarizing typically using CMP to remove the excess overburden of the conducting layer from dielectric layer 94. Dielectric layer 94 electrically isolates read source line 86, read drain line 88, and write bitline 90 from the overlying capacitor 104 (FIGS. 16A and 16B), which is formed as described below.

Figure 15A:
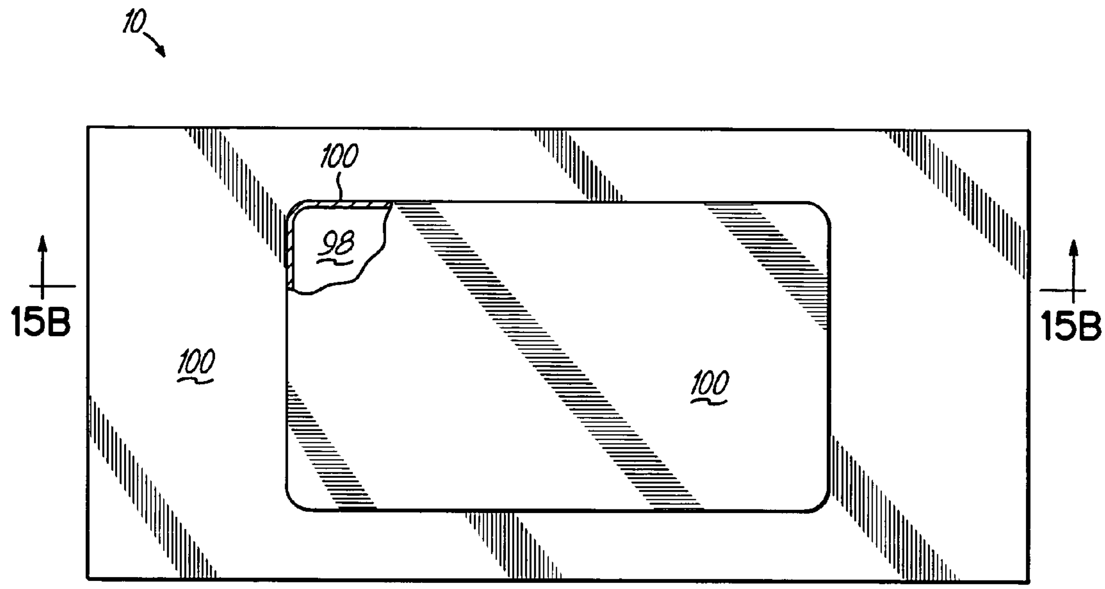
Figure 15B:
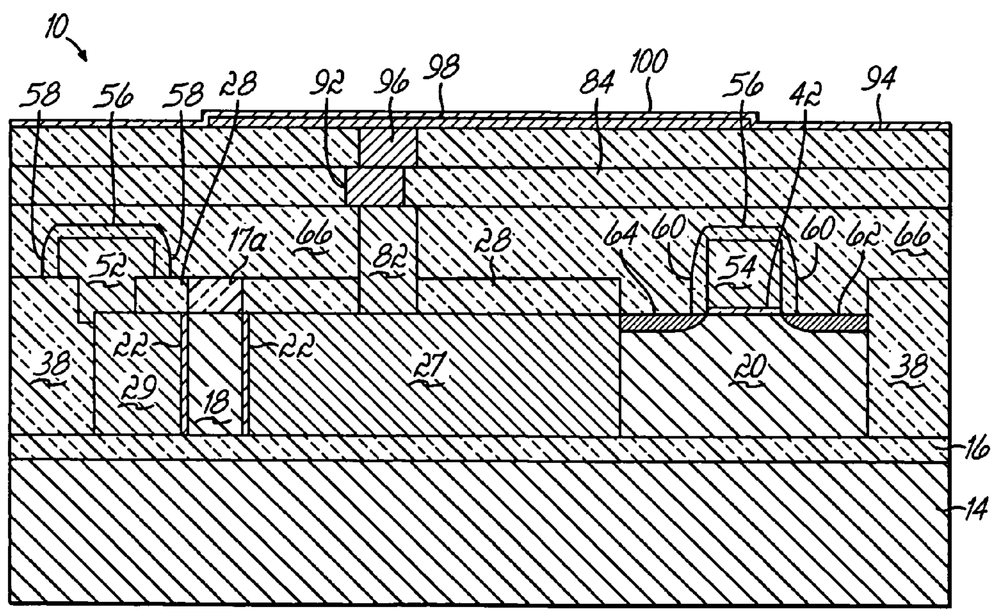

With reference to FIGS. 15A and 15B in which like features refer to like reference numerals in FIGS. 14A and 14B and at a subsequent fabrication stage, a layer of a suitable conducting material, such as doped polysilicon, a silicide, metals (e.g., Au, Al, Mo, W, Ta, Ti, or Cu), or the like, is deposited by evaporation, sputtering, or another known technique and then patterned by a conventional lithography and etch process to define a lower capacitor electrode or plate 98 electrically coupled with capacitor stud 96. A capacitor dielectric 100 of a dielectric material is deposited across substrate 10 by, for example, CVD. Suitable dielectric materials include at least one of $SiO_2$, $Si_3N_4$, silicon oxynitride, alternating layers of $SiO_2$ and $Si_3N_4$, tantalum pentaoxide ($Ta_2O_5$), barium strontium titanate (BST), and lead zirconate titanate (PZT). Preferably, the capacitor dielectric 100 is formed from a material characterized by a high dielectric constant (e.g., at least about nine) such as BST, PZT, or $Ta_2O_5$.

With reference to FIGS. 16A and 16B in which like features refer to like reference numerals in FIGS. 15A and 15B and at a subsequent fabrication stage, another layer of a suitable conducting material, such as doped polysilicon, a silicide, metals (e.g., Au, Al, Mo, W, Ta, Ti, or Cu), or the like, is deposited by evaporation, sputtering, or another known technique and then patterned by a conventional lithography and etch process to define an upper capacitor electrode or plate 102 electrically isolated from capacitor plate 98 by capacitor dielectric 100. The upper capacitor plate 102 is grounded. The upper and lower capacitor plates 98, 102 and the capacitor dielectric 100 collectively define a storage device or capacitor 104 that is electrically coupled by contact 82, capacitor contact 92 and capacitor stud 96 with one of the gate electrodes 27 of the read device 37. The completed structure defines a single memory gain cell 106.

In use and with reference to FIGS. 16A and 16B, multiple memory gain cells 106 are electrically coupled with peripheral circuitry to define a memory circuit. The peripheral circuitry is used to individually address the write device 44 (FIGS. 10A–B) of specific gain cells 106, which are MOSFET's, for charging the capacitor 104 of the addressed memory gain cell 106 to set one of two mutually-exclusive and self-maintaining binary operating states, zero (i.e., off) or one (i.e., on). To that end, the peripheral circuitry supplies voltage to the write line 54 that causes the write device 44 to vary the resistivity of the channel separating source/drain regions 62 and 64. Charge transferred between source/drain region 64 and the capacitor 104 electrically charges or electrically discharges the capacitor 104 to set the binary operating state.

The peripheral circuitry addresses the read device 37 of specific gain cells 106, which is a double-gated FinFET, for sensing the binary operating state (i.e., stored charge) of the capacitor 104 of the addressed gain cell 106. The stored operating binary state is detected by the current flowing through the channel of silicon fin 18 between source/drain regions 34 and 36, which are coupled between read source line 86 and read drain line 88 when voltage is supplied to the read line 52 from the peripheral circuitry. The voltage is transferred to the gate electrode 29 of the read device 37. The current flowing through the channel of the read device 37 is a function of the stored charge on the capacitor 104, which supplies a voltage to gate electrode 27 of the read device 37, and reflects the binary operating state of the addressed memory gain cell 106. More specifically, the current flowing through the channel of read device 37 between the source/drain regions 34 and 36 is greater if capacitor 104 is charged high (i.e., on) as opposed to being charged low (i.e., off).

In accordance with an alternative embodiment of the invention, a memory circuit may be formed from individual memory gain cells each featuring a deep trench capacitor, in contrast to the stacked capacitor 104 (FIGS. 16A and 16B). Other than this difference, the structure of the two types of memory gain cells is substantially identical. The fabrication process of a memory gain cell with a deep trench capacitor is detailed in the following description.

Figure 17A:
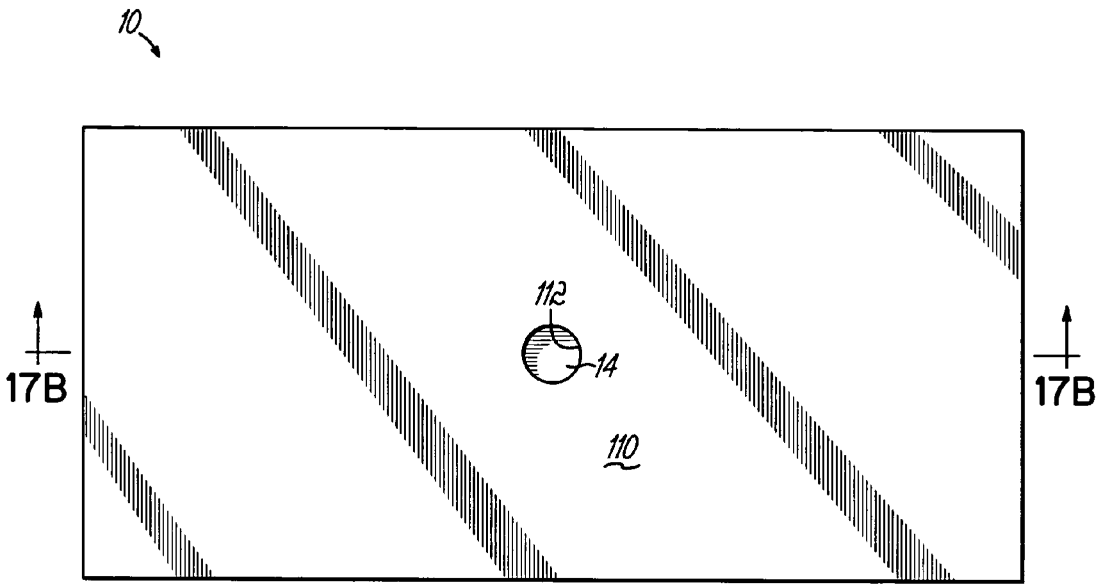
Figure 17B:
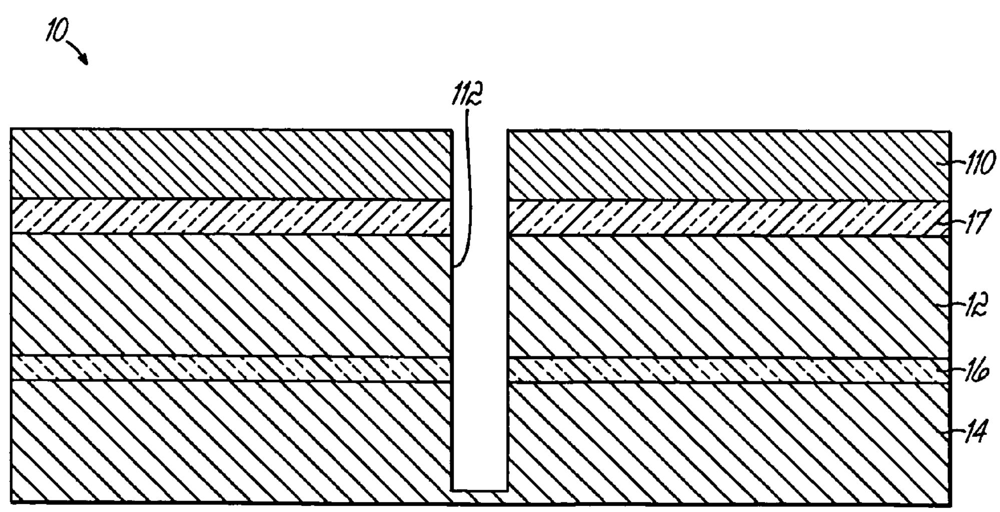

With reference to FIGS. 17A and 17B in which like features refer to like reference numerals in FIGS. 1A and 1B and at a subsequent fabrication stage, a patterned resist layer 110 is formed across the substrate 10. A deep trench 112 is formed vertically by an anisotropic dry etch process that removes portions of layer 17, active layer 12, insulating layer 16, and handle wafer 14. In this embodiment of the invention, the handle wafer 14 is formed from a conductive material, such as heavily doped silicon.

Figure 18A:
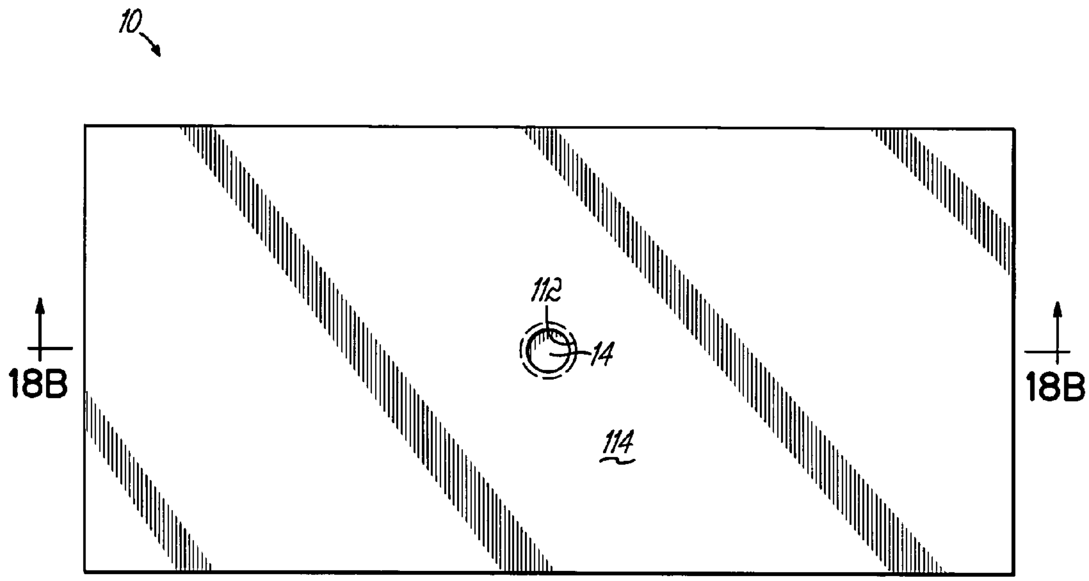
Figure 18B:
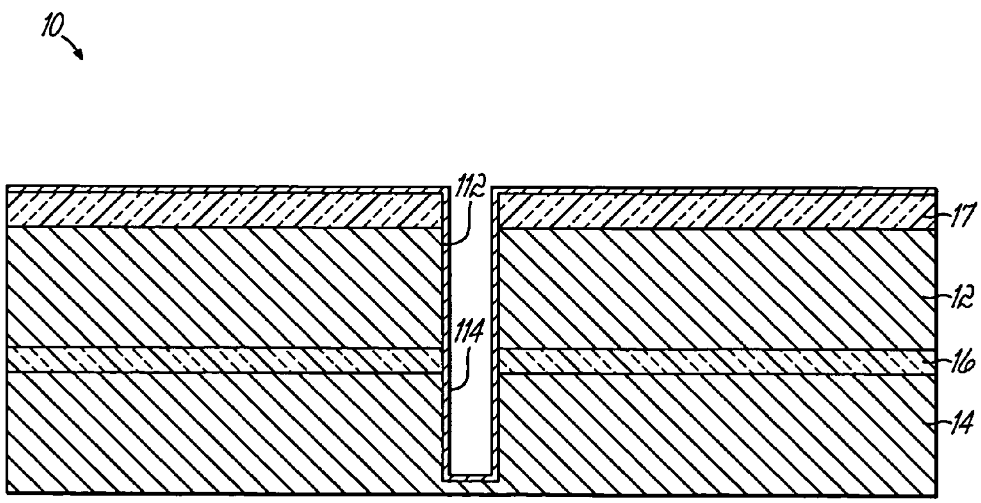

With reference to FIGS. 18A and 18B in which like features refer to like reference numerals in FIGS. 17A and 17B and at a subsequent fabrication stage, resist layer 110 is stripped and a capacitor dielectric 114 is applied to the vertical sidewall of the deep trench 112. Capacitor dielectric 114 may comprise an oxide (i.e., $SiO_2$) grown from either a dry oxygen ambient or steam or $Si_3N_4$ or $SiO_xN_y$ deposited by CVD.

Figure 19A:
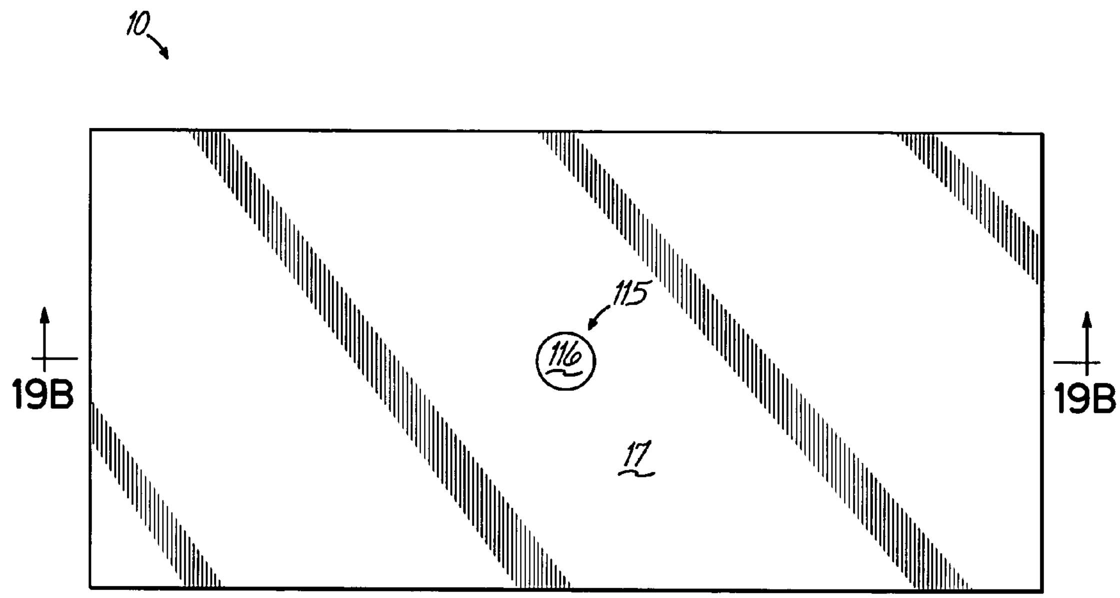
Figure 19B:
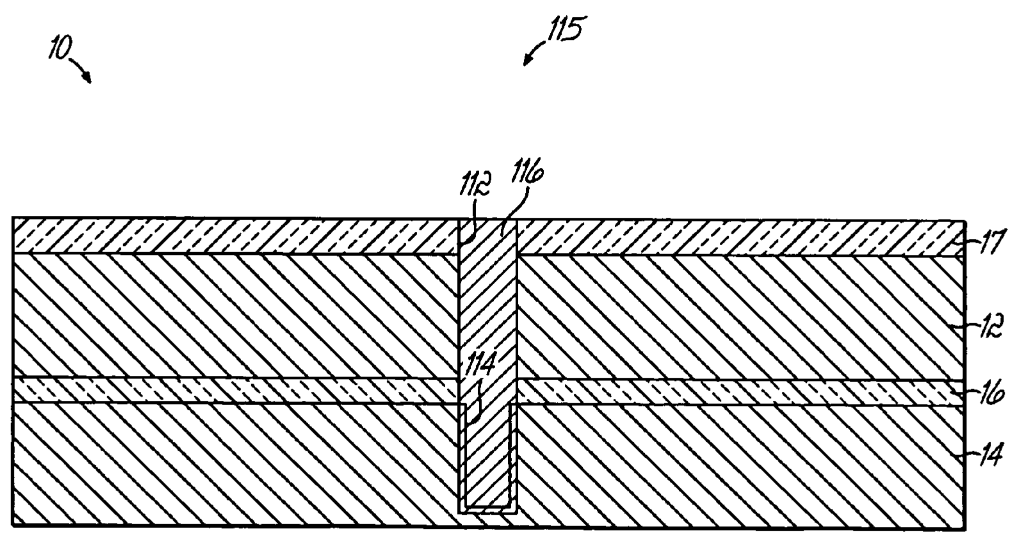

With reference to FIGS. 19A and 19B in which like features refer to like reference numerals in FIGS. 18A and 18B and at a subsequent fabrication stage, the deep trench 112 is filled with a plug 116 of a suitable conducting material, such as doped polysilicon, a silicide, metals (e.g., Au, Al, Mo, W, Ta, Ti, or Cu). The plug 116 is recessed by an anisotropic dry etch process and the capacitor dielectric 114 covering the sidewall of active layer 12 is removed. The plug 116 is refilled up to the depth of layer 17 by conformally depositing a layer of suitable conducting material, such as doped polysilicon, a silicide, metals (e.g., Au, Al, Mo, W, Ta, Ti, or Cu) or the like, by evaporation, sputtering, or another known technique, and planarizing typically using CMP to remove the excess overburden of the conducting layer from layer 17. Plug 116 and the portion of handle wafer 14 adjacent to the vertical sidewall covered by capacitor dielectric 114 operate as plates or electrodes of a deep trench capacitor, generally indicated by reference numeral 115, separated by capacitor dielectric 114.

Figure 20A:
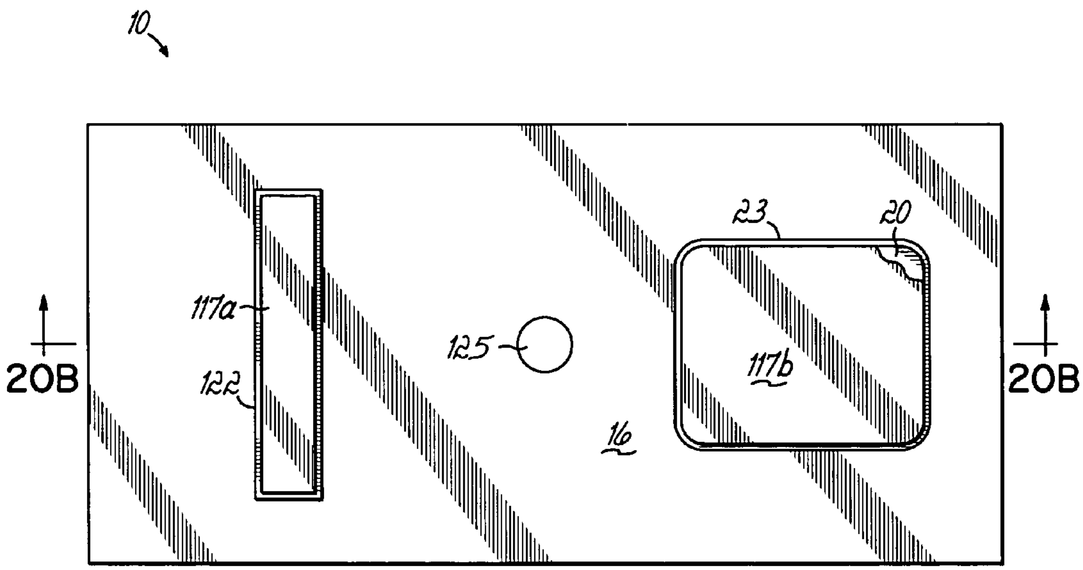
Figure 20B:
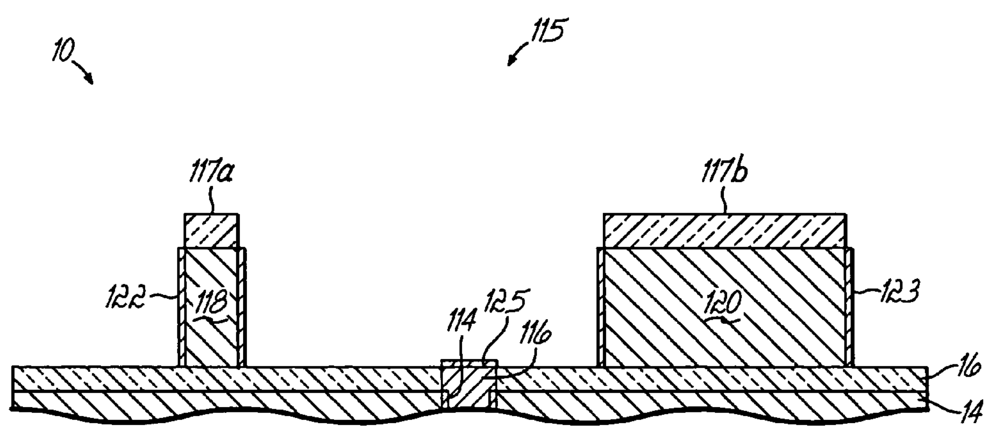
Figure 27A:
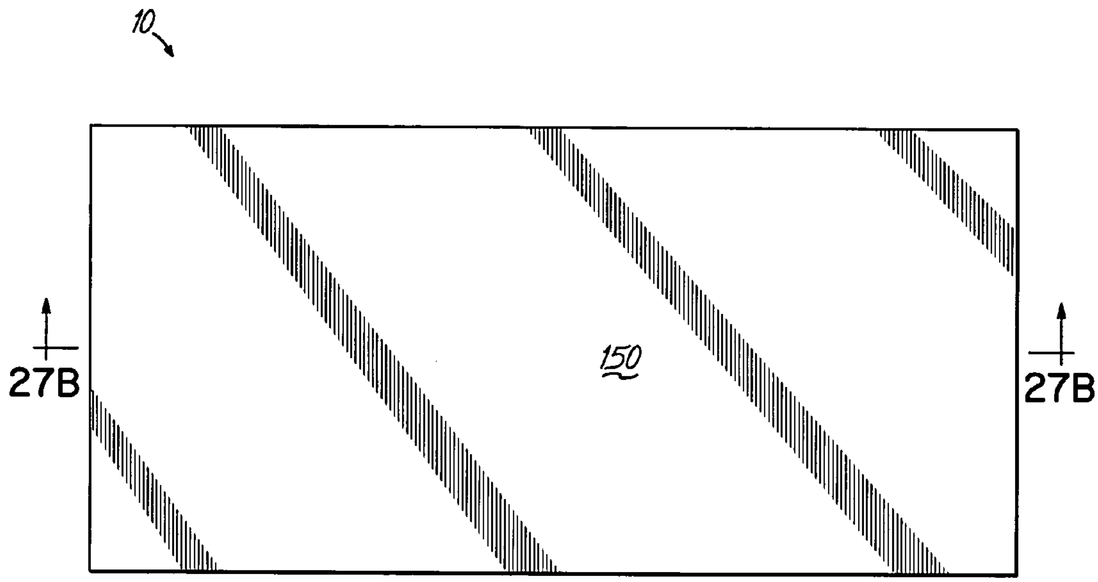
Figure 27B:
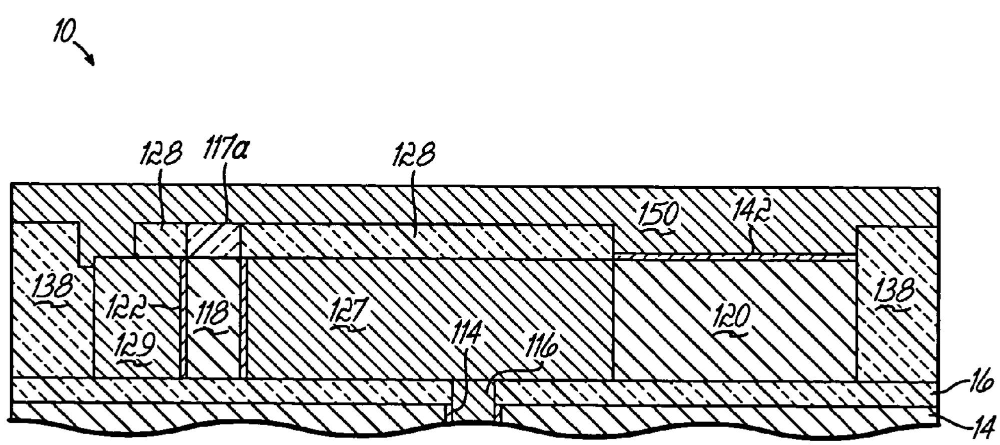

With reference to FIGS. 20A and 20B in which like features refer to like reference numerals in FIGS. 19A and 19B and at a subsequent fabrication stage, active layer 12 and layer 17 are patterned by a standard lithography and etch process to define a silicon fin 118 for building a read device 137 (FIGS. 24A and 24B) and a silicon body 120 from active layer 12 to be used as a substrate for building a write device 144 (FIGS. 27A and 27B). The etch process is selected to stop at the horizontal plane of the insulating layer 16. The etch process also removes portions of plug 116 such that these structures are coplanar with the horizontal plane of insulating layer 16. Silicon fin 118 and silicon body 120 are covered by capping layers 117*a*, 117*b*, respectively, which represent the remnants of layer 17.

A gate dielectric 122 is formed on the vertical sidewall of the silicon fin 118. Gate dielectric 122 may comprise an oxide (i.e., $SiO_2$) grown from either a dry oxygen ambient or steam or a deposited layer of $SiO_2$. Alternatively, the gate dielectric 122 may be formed from any of the many candidate high dielectric constant (high-k) materials, including but not limited to $Si_3N_4$, $SiO_xN_y$, a gate dielectric stack of $SiO_2$ and $Si_3N_4$, and metal oxides like $Ta_2O_5$, as recognized by persons of ordinary skill in the art. A dielectric layer 123 may also be applied by the process forming gate dielectric 122 to the vertical sidewall of silicon body 120. Another dielectric layer 125 may also be applied by the process forming gate dielectric 122 to the horizontal surface of plug 116. In FIGS. 20B–30B, the structure of deep trench capacitor 115 is partially omitted for clarity.

Figure 21A:
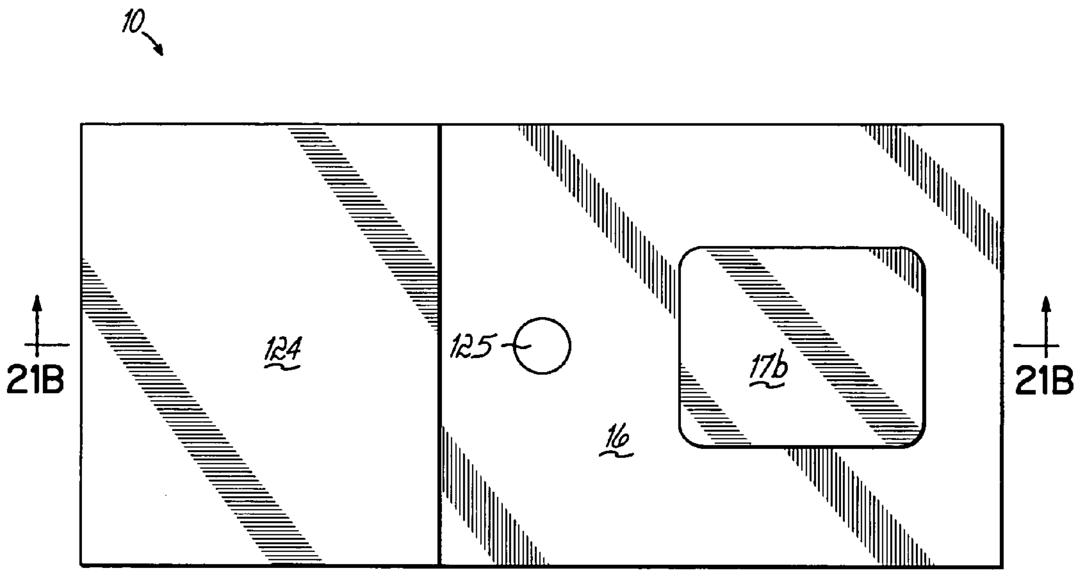
Figure 21B:
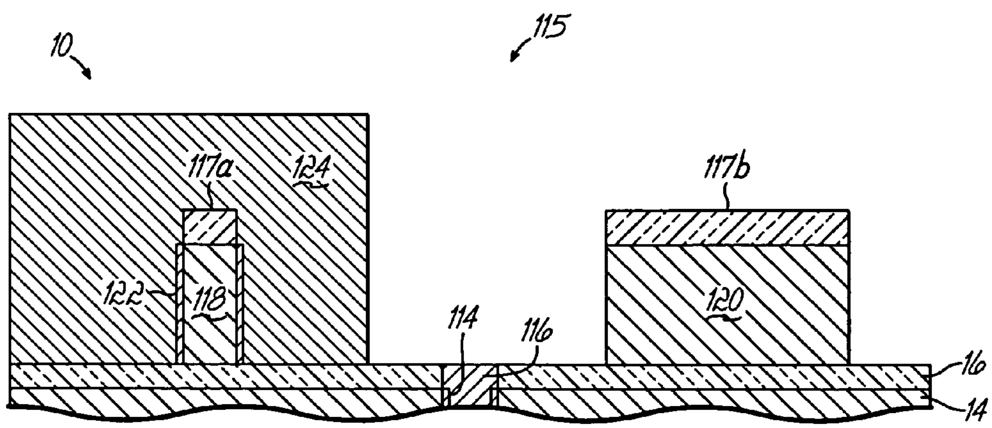
Figure 22A:
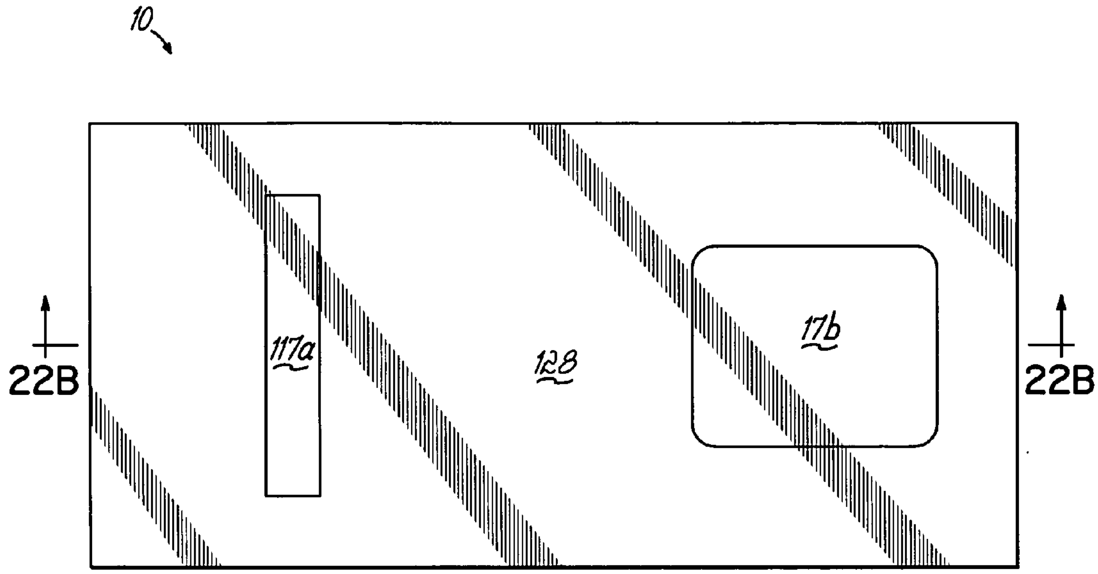
Figure 22B:
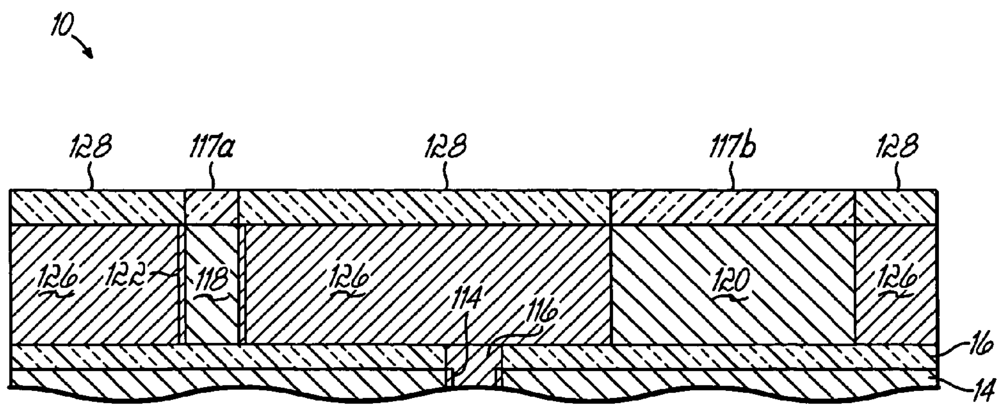

With reference to FIGS. 21A and 21B in which like features refer to like reference numerals in FIGS. 22A and 22B and at a subsequent fabrication stage, the silicon fin 118 is masked by a resist layer 124. An etch process, such as an isotropic etch process, is used to remove the dielectric layers 123 and 125, which may be formed as an artifact of the process forming gate dielectric 122.

With reference to FIGS. 22A and 22B in which like features refer to like reference numerals in FIGS. 21A and 21B and at a subsequent fabrication stage, the resist layer 124 is stripped following the completion of the etch process removing dielectric layers 123 and 125. A gate conductor layer 126 is deposited for filling the trenches surrounding silicon fin 118 and silicon body 120 and other trenches between adjacent silicon fins and regions (not shown). Gate conductor layer 126 may be any suitable conducting material including, but not limited to, polysilicon, amorphous silicon, a combination of amorphous silicon and polysilicon, and polysilicon-germanium, deposited as a doped layer. In certain alternative embodiments of the invention, the gate conductor layer 126 may be formed from one or more metals, such as tungsten, titanium, tantalum, molybdenum, or nickel, a metal silicide, or a metal nitride, deposited using physical vapor deposition, chemical vapor deposition, or any other technique known in the art.

Layer 126 is polished and recessed vertically by an anisotropic etch process. The recessed layer 126 is covered by a layer 128 of an appropriate dielectric material, such as $SiO_2$, conformally deposited by CVD. Layer 128 is polished flat and planarized by CMP or any other suitable planarization technique relying on the upper horizontal surface of capping layers 117*a,b* as a polish stop.

Figure 23A:
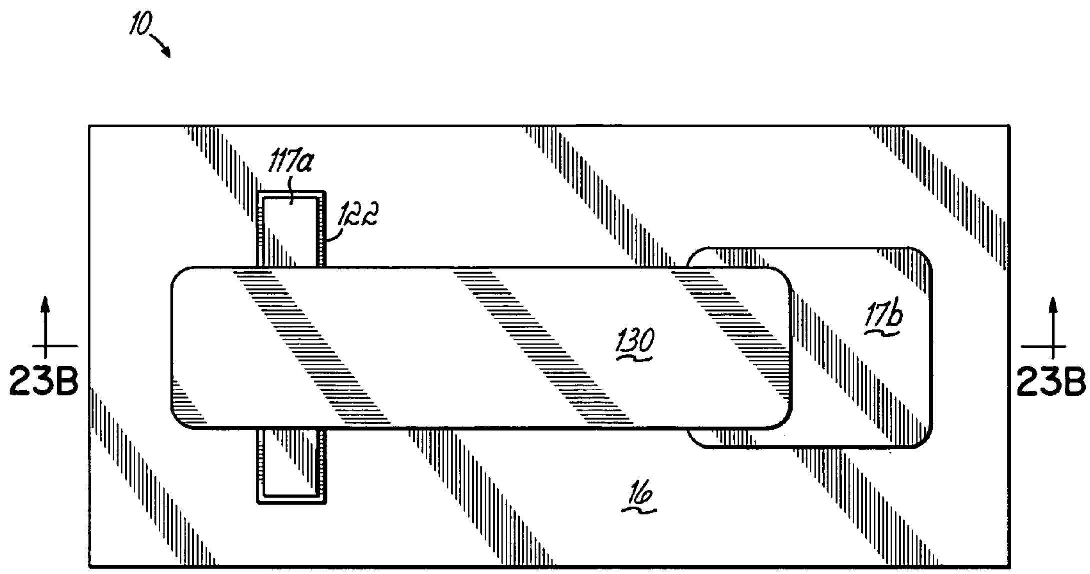
Figure 23B:
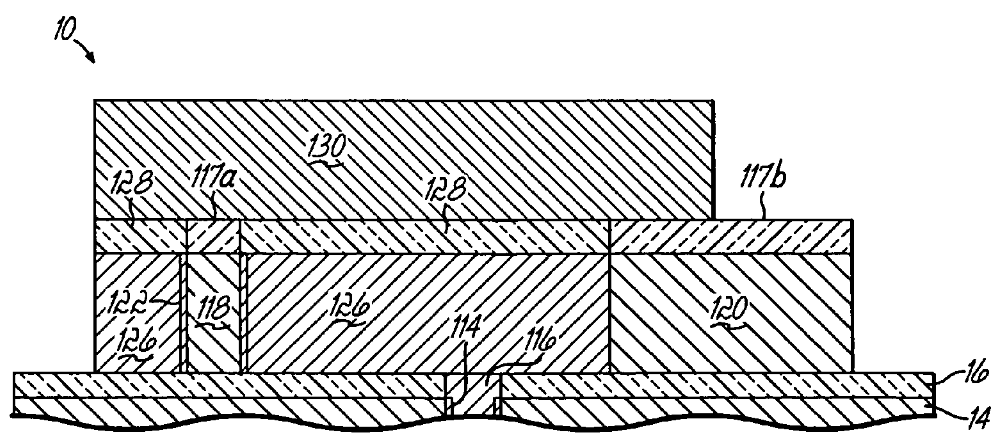

With reference to FIGS. 23A and 23B in which like features refer to like reference numerals in FIGS. 22A and 22B and at a subsequent fabrication stage, a patterned resist layer 130 is formed by a conventional process. An etch process selective to the resist layer 130 and the material forming capping layer 117*b*, which collectively define masked areas, is used to selectively remove layers 126 and 128 in unmasked areas. Insulating layer 16 operates as an etch stop for the etch process. The residual portion of layer 126 defines gate electrodes 127 and 129 (FIG. 24B) formed adjacent to gate dielectric 122 and on opposing vertical sidewalls of the silicon fin 118. Gate electrode 127 is electrically coupled with plug 116 of capacitor 115. The gate dielectric 122 electrically isolates the gate electrodes 127 and 129 from the silicon fin 118.

Figure 24A:
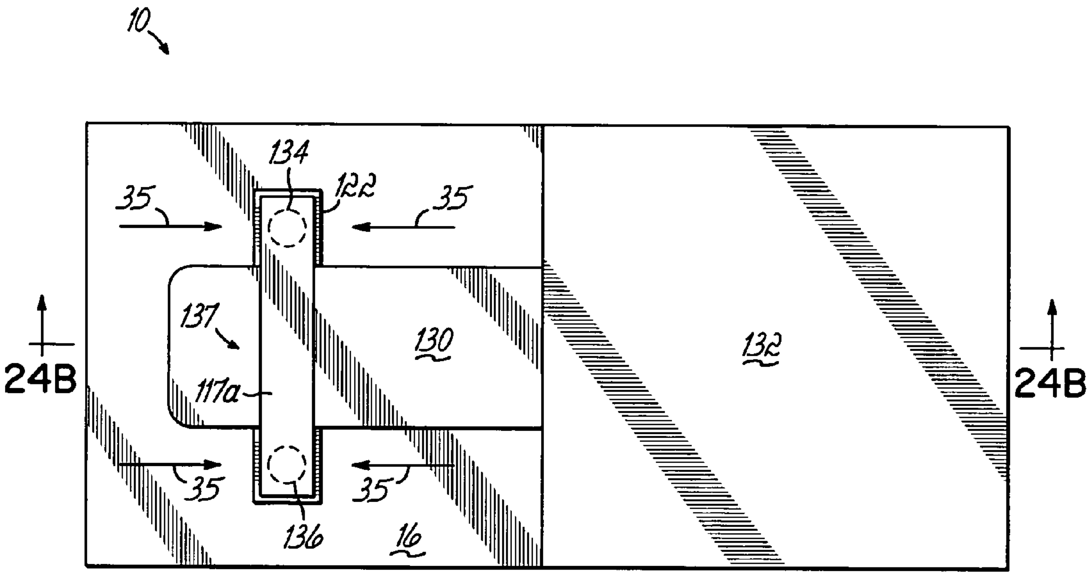
Figure 24B:
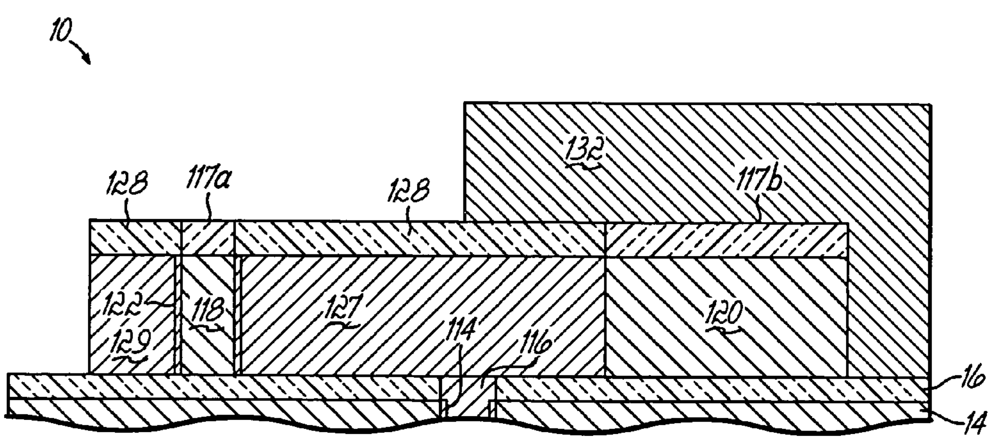

With reference to FIGS. 24A and 24B in which like features refer to like reference numerals in FIGS. 23A and 23B and at a subsequent fabrication stage, resist layer 130 is stripped and another patterned resist layer 132 is applied generally over silicon body 120 and surrounding portions of insulating layer 16. Source/drain regions 134 and 136 are defined in the opposite ends of silicon fin 118 by doping with impurities, such as n-type or p-type impurities. Formation of the source/drain regions 134 and 136 may be accomplished using any of the variety of methods that have been developed to form source/drain regions and that are tailored for specific performance requirements. For example, the source/drain regions 134 and 136 may be formed in silicon fin 118 by implanting an ion dose, typically on the order of about $5\times10^{14}$ atoms/$cm^2$ or greater, of a suitable n-type or p-type impurity with an implant energy of 1 keV to 100 keV. Source/drain regions 134 and 136 each have a junction that is self-aligned to one of opposite side edges of gate electrodes 127 and 129, respectively. A portion of the silicon fin 118 located between the source/drain regions 134 and 136, which is shielded during the implantation, defines a channel that has a resistivity regulated by voltage applied to the gate electrodes 127 and 129 and capacitively coupled through gate dielectric 122. This structure defines a read device 137 for the memory gain cell.

Figure 25A:
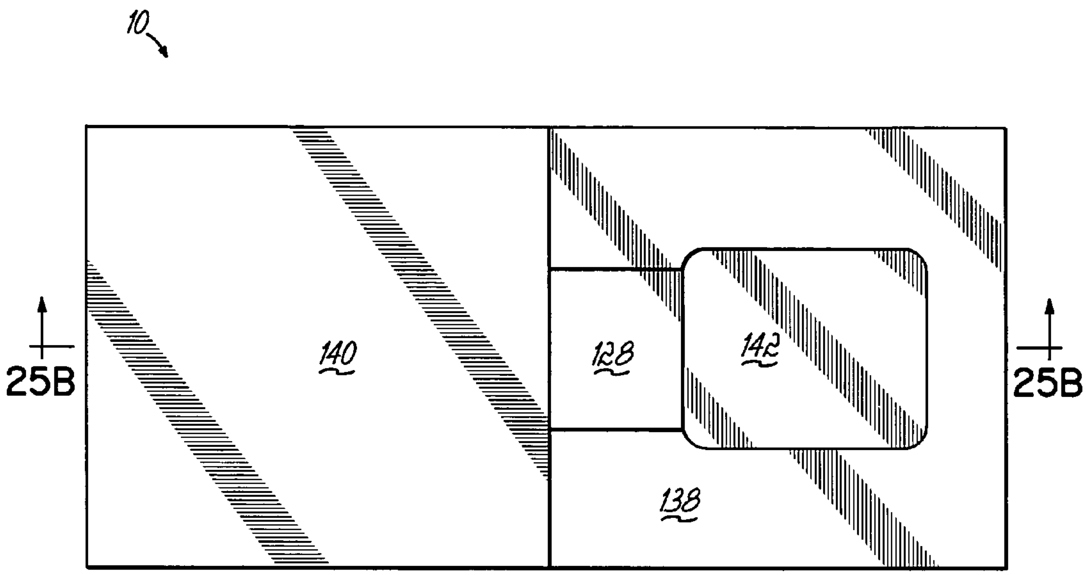
Figure 25B:
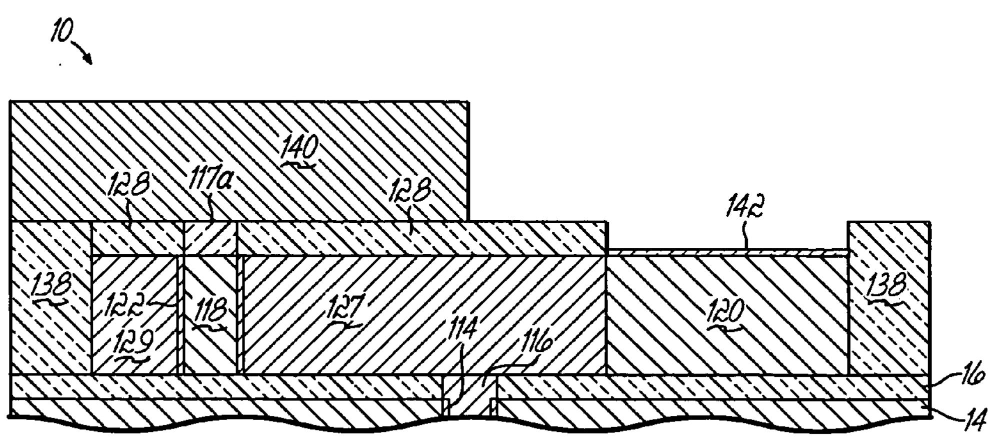

With reference to FIGS. 25A and 25B in which like features refer to like reference numerals in FIGS. 24A and 24B and at a subsequent fabrication stage, resist layer 132 is stripped and an insulating layer 138 is conformally deposited on substrate 12. Insulating layer 138 is polished flat and planarized by a planarization technique, such as CMP, relying on the upper horizontal surface of capping layers 117*a,b* as a polish stop. Insulating layer 138 may be constituted, for example, by TEOS-$SiO_2$ deposited by CVD. A patterned resist layer 140 is applied generally over silicon fin 118 and surrounding portions of insulating layer 138. Capping layer 117_b_ is removed from silicon body 120 by a dry etch process selective to the material of insulating layer 138. The resist layer 140 is stripped and a gate dielectric 142 is formed atop silicon body 120. Gate dielectric 142 may comprise an oxide (i.e., $SiO_2$) grown from either a dry oxygen ambient or steam. The thickness of gate dielectric 142 may vary depending upon the required performance of the write device 144 (FIGS. 27A and 27B) being formed.

Figure 26A:
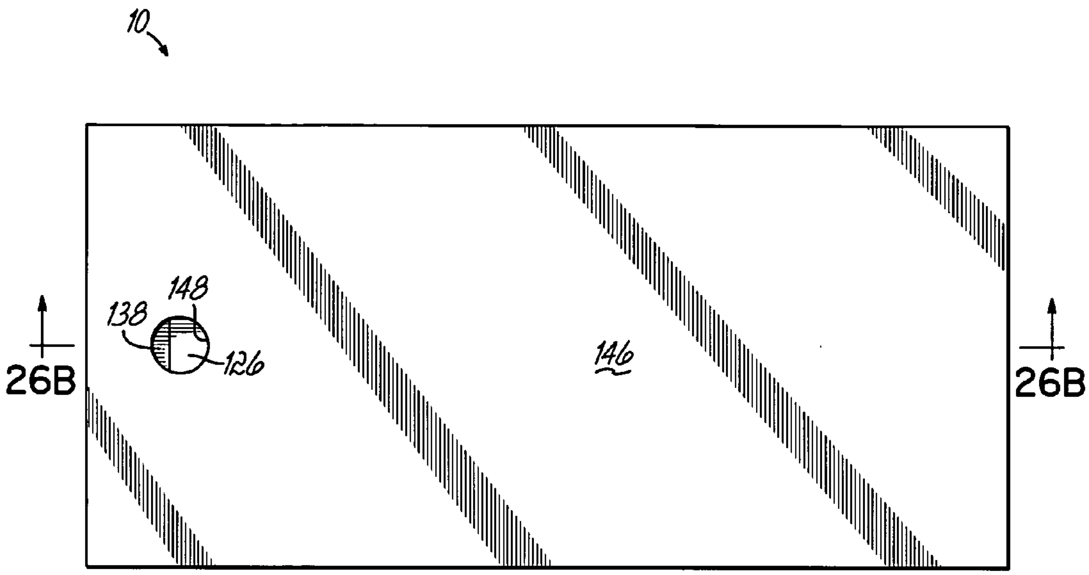
Figure 26B:
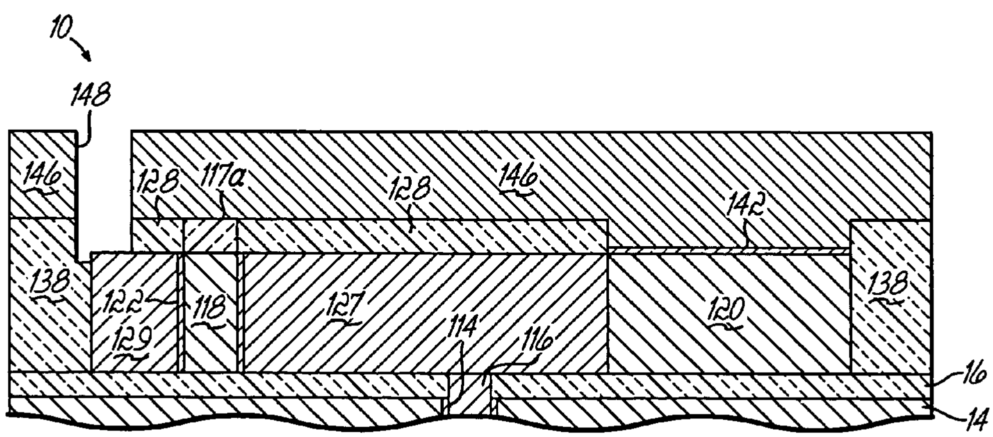

With reference to FIGS. 26A and 26B in which like features refer to like reference numerals in FIGS. 25A and 25B and at a subsequent fabrication stage, a patterned resist layer 146 is formed across the substrate 10. A contact opening 148 is formed by an anisotropic dry etch process that removes the material of insulating layer 138 selective to the material constituting gate electrode 129.

With reference to FIGS. 27A and 27B in which like features refer to like reference numerals in FIGS. 26A and 26B and at a subsequent fabrication stage, resist layer 146 is stripped following the completion of the etch process removing contact opening 148. A conductive layer 150 is conformally deposited on substrate 10 that fills the contact opening 148 and fills the space overlying the gate dielectric 142. Conductive layer 150 may be any suitable conducting material including, but not limited to, polysilicon, amorphous silicon, a combination of amorphous silicon and polysilicon, and polysilicon-germanium, deposited as a doped layer. In certain alternative embodiments of the invention, conductive layer 150 may be formed from one or more metals, such as tungsten, titanium, tantalum, molybdenum, or nickel, a metal silicide, or a metal nitride, deposited using physical vapor deposition, chemical vapor deposition, or any other technique known in the art.

Figure 28A:
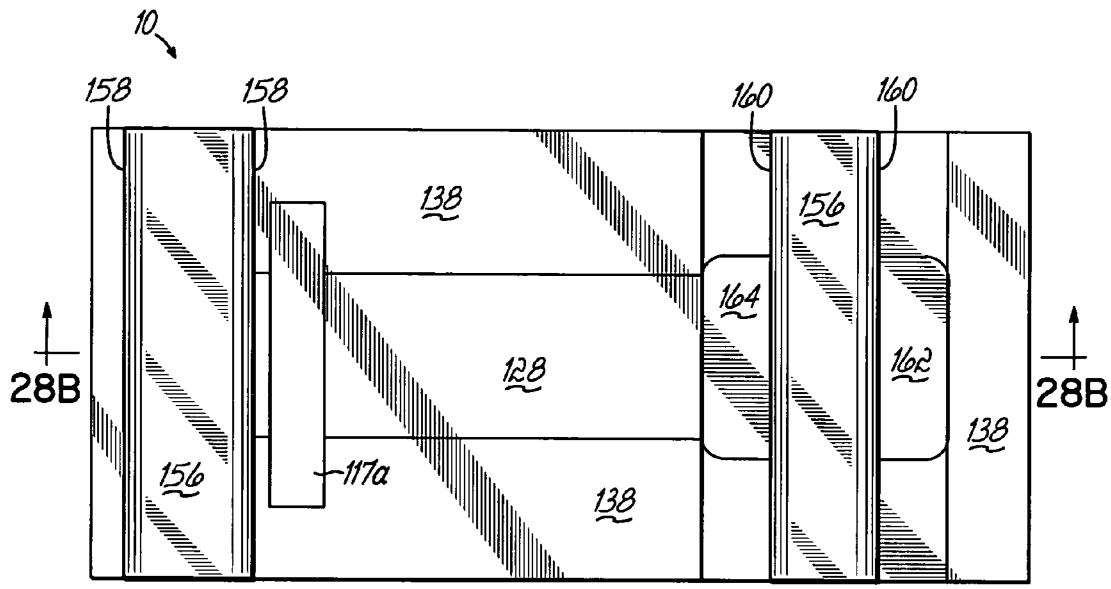
Figure 28B:
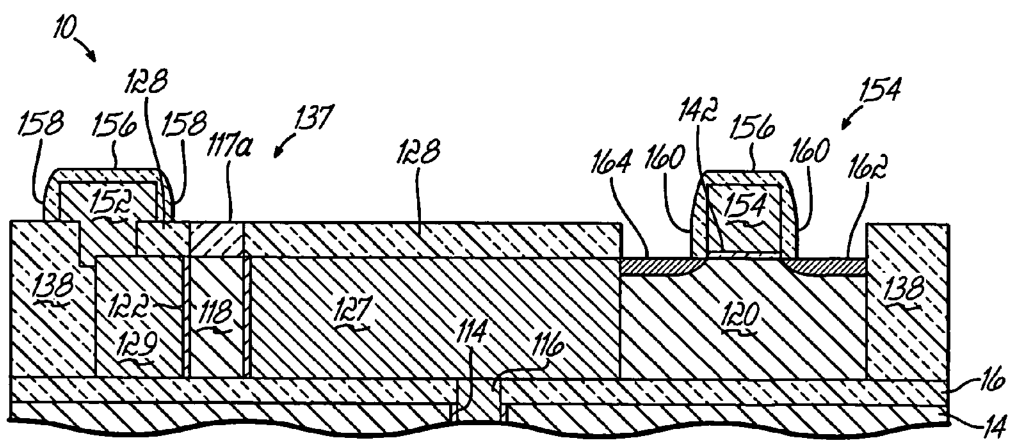

With reference to FIGS. 28A and 28B in which like features refer to like reference numerals in FIGS. 27A and 27B and at a subsequent fabrication stage, a read line 152 and a write line 154 are formed. To that end, an optional capping layer 156 of a hard mask material is deposited on the conductive layer 50 and is patterned in conjunction with the conductive layer 150. The conductive layer 150 and the capping layer 156, if present, are patterned by a standard lithography and etch process to define read line 152 and write line 154 using a patterned layer of resist (not shown) as a template. The length of write line 154 overlying gate dielectric 142 operates as a gate electrode for write device 144 of the depicted exemplary memory gain cell, which is among the many identical gain cells constituting the memory circuit. The write line 154 electrically couples write devices 144 aligned in a column of the memory circuit. Other write lines, similar to and generally parallel with write line 154, electrically couple write devices 144 in other columns of the memory circuit being fabricated.

After the resist is stripped, sidewall spacers 158 and 160 are then formed on the read line 152 and write line 154, respectively, from a material such as $Si_3N_4$, as is familiar to persons of ordinary skill in the art. Write line 154 and sidewall spacer 160 serve as a self-aligned mask for implanting a dopant species to form source/drain regions 162 and 164. The technique of implanting dopant species to form source/drain regions 162 and 164 is familiar to persons of ordinary skill in the art. Briefly, a dopant species suitable for either p-type or n-type source/drain regions 162 and 164 is implanted into silicon body 120 using write line 154 and sidewall spacer 160 as a self-aligned ion implantation mask, followed by a thermal anneal that activates the dopant and removes implantation damage. Source and drain extensions (not shown) may be formed on opposite sides of write line 154 before the spacer 160, such as by using a technique known to persons of ordinary skill in the art. A portion of active layer 12 defined between the source/drain regions 162 and 164 comprises a channel having a resistivity that is controlled by voltage supplied from a power supply to the write line 154 and electrostatically coupled to the channel through the gate dielectric 142.

Figure 29A:
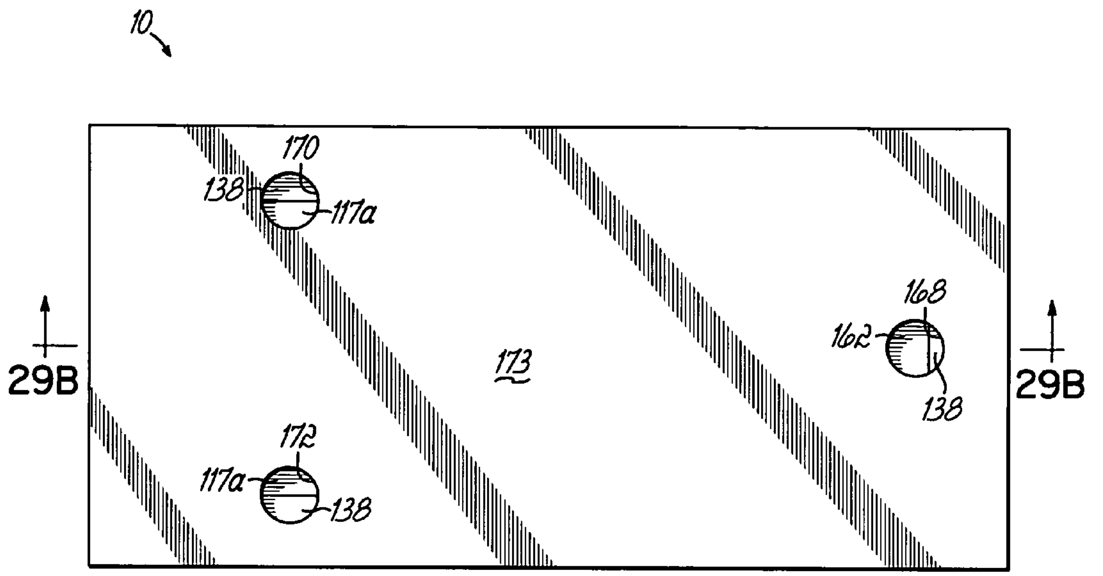
Figure 29B:
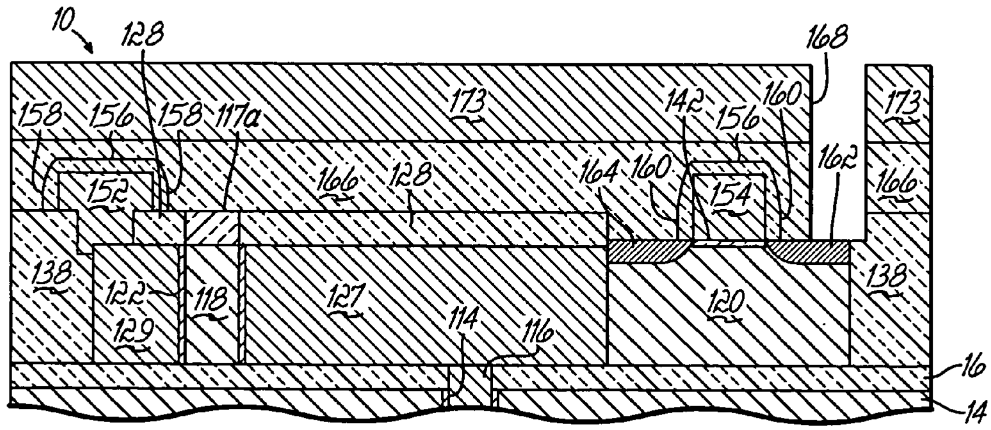

With reference to FIGS. 29A and 29B in which like features refer to like reference numerals in FIGS. 28A and 28B and at a subsequent fabrication stage, a layer 166 of a dielectric, such as TEOS $SiO_2$, is deposited by, for example, CVD across substrate 10 and then polished flat by CMP or any other suitable planarization technique. Contact openings 168, 170 and 172 are structured and etched using a conventional lithography and anisotropic etch process that uses a patterned resist layer 173 as a template. Contact opening 168 extends to depth of and exposes source/drain region 162 of the write device 144. Contact openings 170 and 172 extend to depth of and expose source/drain regions 134 and 136, respectively, of the read device 137.

Figure 30A:
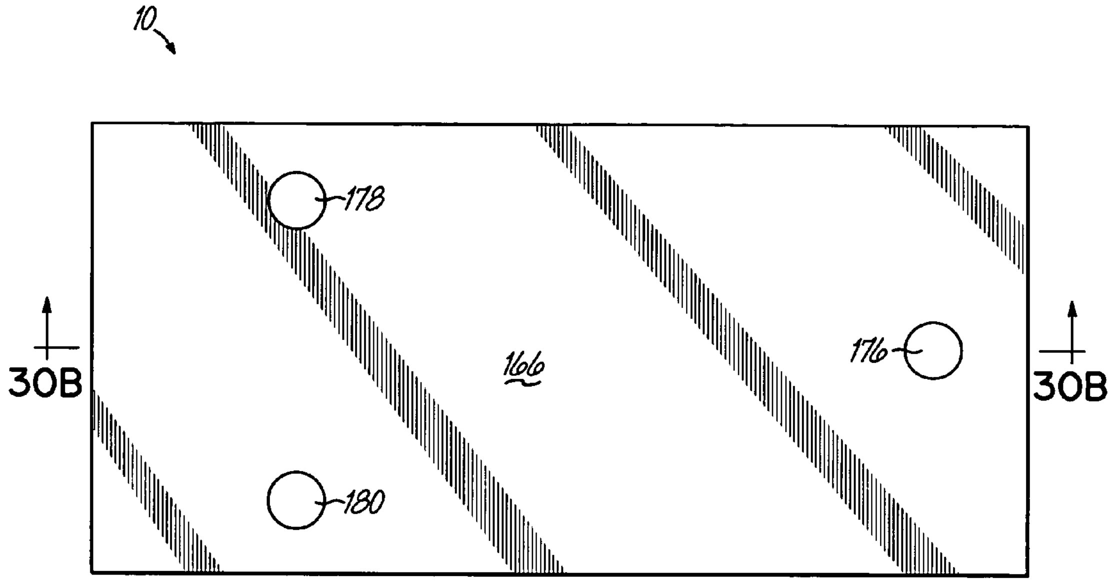
Figure 30B:
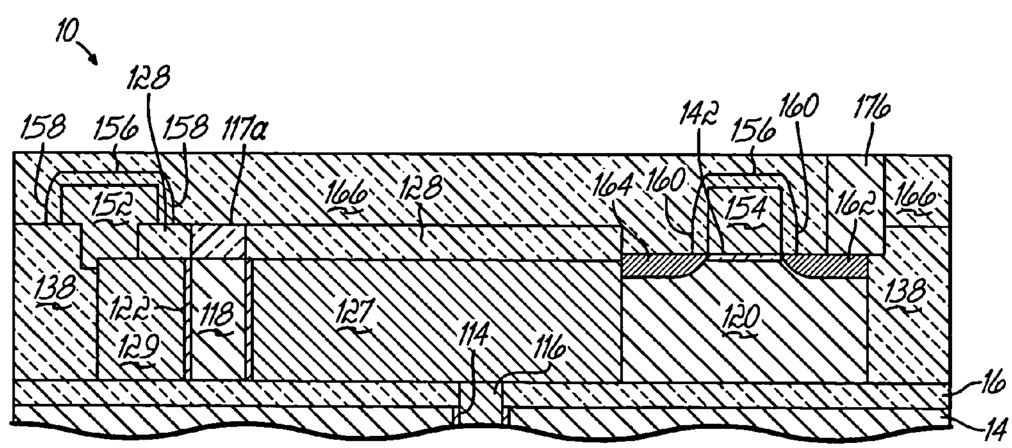

With reference to FIGS. 30A and 30B in which like features refer to like reference numerals in FIGS. 29A and 29B and at a subsequent fabrication stage, openings 168, 170, and 172 are filled by corresponding contacts 176, 178, and 180 of a conducting material to conclude a damascene process flow. Accordingly, a layer of a suitable conducting material, such as doped polysilicon, a silicide, metals (e.g., Au, Al, Mo, W, Ta, Ti, or Cu), or the like, is conformally deposited by evaporation, sputtering, or another known technique and then planarized typically using CMP to remove the excess overburden of the conducting layer from dielectric layer 166.

Figure 31A:
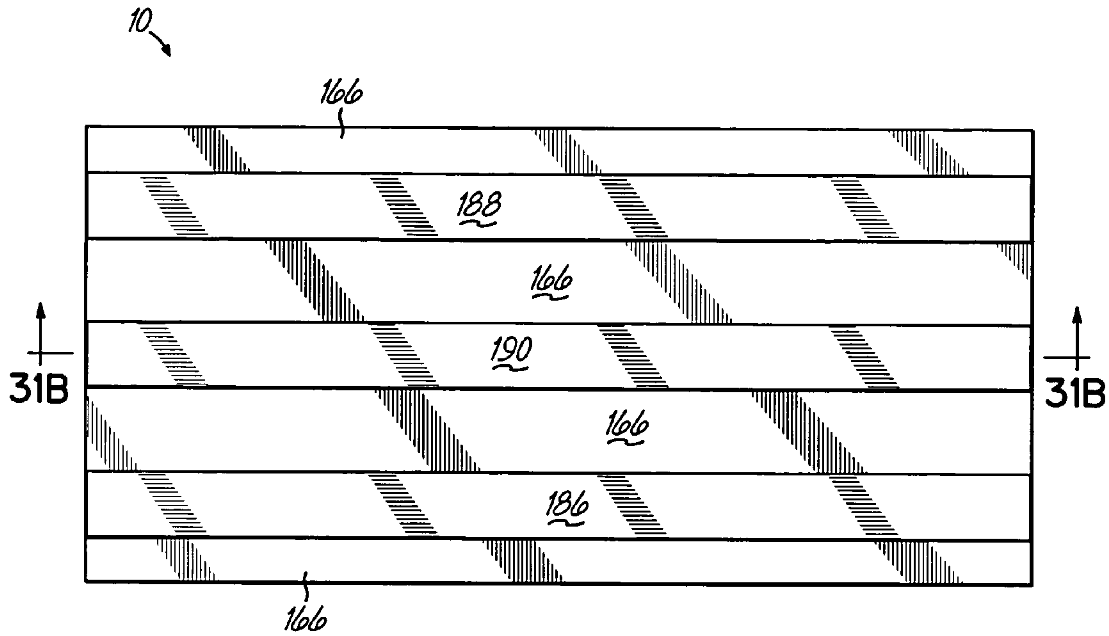
Figure 31B:
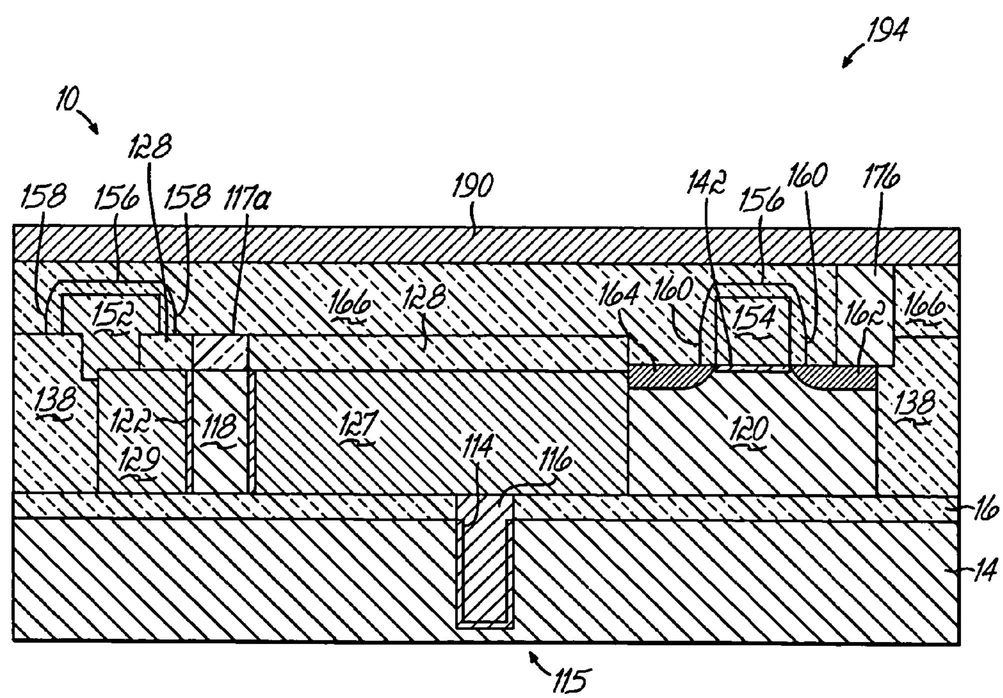

With reference to FIGS. 31A and 31B in which like features refer to like reference numerals in FIGS. 30A and 30B and at a subsequent fabrication stage, a read source line 186, a read drain line 188, and a write bitline 190 are patterned using a conventional lithography and etch process from a layer of a suitable conducting material, such as doped polysilicon, a silicide, metals (e.g., Au, Al, Mo, W, Ta, Ti, or Cu), or the like, is conformally deposited by evaporation, sputtering, or another known technique and then planarized typically using CMP to remove the excess overburden of the conducting layer from dielectric layer 166. The read source line 186 and read drain line 188 are coupled by contacts 180 and 178 with source/drain regions 134 and 136, respectively, of read device 137 and source/drain regions 134, 136 of the read device 137 of other memory gain cells (not shown). The write bitline 190 is coupled by contact 176 with source/drain region 162 of the write device 144 and extends to the source/drain region of the write device 144 of other memory gain cells (not shown). Additional read source and drain lines and write bitlines (not shown) electrically couple gain cells in other rows of the memory circuit.

In use and with reference to FIGS. 31A and 31B, the completed memory gain cell 194 is electrically coupled with other memory gain cells (not shown) identical to memory gain cell 194 which are all electrically coupled with peripheral circuitry to define a memory circuit. The peripheral circuitry is used to individually address the write device 144 of specific gain cells 194, which are MOSFET's, for charging the capacitor 115 of the addressed memory gain cell 194 to set one of two mutually-exclusive and self-maintaining binary operating states, zero (i.e., off) or one (i.e., on). The peripheral circuitry addresses the read device 137 of specific gain cells 194, which is a double-gated FinFET, for sensing the binary operating state (i.e., stored charge) of the capacitor 115 of the addressed gain cell 106. The current flowing through the channel of read device 137 between the source/ drain regions 134 and 136 is greater if capacitor 104 is charged high (i.e., on), which supplies a greater voltage to gate electrode 127, as opposed to being charged low (i.e., off). The operation of the memory gain cell 194 is similar to the operation of memory gain cells 106, as described above.

The fabrication of the memory gain cells 106 and memory gain cells 194 has been described by a specific order of fabrication stages and steps. However, it is understood that the order may differ from that described. For example, the order of two or more steps may be altered relative to the order shown. Also, two or more steps may be carried out concurrently or with partial concurrence. In addition, various steps may be omitted and other steps may be added. It is understood that all such variations are within the scope of the invention.

The memory gain cells 106, 194 of the invention utilize a dual-gated FinFET structure and a planar write device to provide a memory gain cell having a compact footprint. The dual-gated FinFET yields a compact structure through the use of self-aligned opposing gates on the FinFET. The incorporation of either a deep trench capacitor 115 for memory gain cell 194 or a stacked capacitor 104 for memory gain cell 106 maintains the compact footprint.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A memory cell comprising:

a storage device capable of holding a stored electrical charge;

a read device including a semiconducting fin, a first gate electrode and a second gate electrode flanking said semiconducting fin, a gate dielectric electrically isolating said first and said second gate electrodes from said semiconducting fin, and a source and drain formed in said semiconducting fin adjacent to said first and said second gate electrodes, said first gate electrode electrically coupled with said storage device and said second gate electrode operative for gating a region of said semiconducting fin defined between said source and said drain to thereby regulate a current flowing from said source to said drain, said current, when said region of said semiconducting fin is gated, being dependent upon said electrical charge stored by said storage device; and a write device electrically coupled with said storage device, said write device adapted to charge and discharge said storage device to define said stored electrical charge.

2. The memory gain cell of claim 1 wherein said write device comprises a MOSFET.

3. The memory gain cell of claim 2 wherein said MOSFET comprises:

a drain electrically coupled with said storage device;

a source;

a channel region flanked by said source and said drain of said MOSFET; and a gate electrode electrically isolated from said channel region, said gate electrode of said MOSFET operative for controlling a resistivity of said channel region for charging and discharging said stored electrical charge of said storage device by transferring carriers from said source of said MOSFET to said drain of said MOSFET.

4. The memory gain cell of claim 1 wherein said stored electrical charge held by said storage device changes a resistivity of said region of said semiconducting fin.

5. The memory gain cell of claim 1 wherein said storage device comprises a deep trench capacitor positioned in a layer of a conducting material vertically below said read device.

6. The memory gain cell of claim 5 wherein said layer of said conducting material defines a first capacitor plate, and further comprising:

a layer of a dielectric material separating said layer of said conducting material from said semiconducting fin and said second gate electrode.

7. The memory gain cell of claim 6 wherein said deep trench capacitor includes a plug of a conductive material extending vertically into said layer of said conducting material to define a second capacitor plate, said plug positioned vertically below said layer of said conductive material, and a capacitor dielectric electrically isolating said plug from said layer of said conducting material.

8. The memory gain cell of claim 7 further comprising a write device including:

a drain electrically coupled with said plug of said storage device;

a source;

a channel region flanked by said source and said drain of said write device; and a gate electrode electrically isolated from said channel region, said gate electrode of said write device operative for controlling a resistivity of said channel region for charging and discharging the stored charge of said storage device by transferring carriers from said source of said write device to said drain of said write device.

9. The memory gain cell of claim 7 wherein said plug is electrically coupled with said first gate electrode by a contact extending through said layer of said dielectric material.

10. The memory gain cell of claim 6 wherein said semiconducting fin is formed from an active layer of a silicon-on-insulator substrate, said layer of said dielectric material is a buried oxide, and said layer of said conducting material is silicon.

11. The memory gain cell of claim 5 wherein said deep trench capacitor includes a first capacitor plate electrically coupled with said first gate electrode.

12. The memory gain cell of claim 1 wherein said storage device comprises a stacked capacitor positioned vertically above the read device.

13. The memory gain cell of claim 12 wherein said stacked capacitor includes first and second capacitor plates each positioned vertically above the read device and a capacitor dielectric electrically isolating said first and second capacitor plates from each other.

14. The memory gain cell of claim 13 wherein said first capacitor plate is electrically coupled with said first gate electrode.

15. The memory gain cell of claim 14 further comprising:

a layer of a dielectric material separating said layer of said conducting material from said semiconducting fin and said second gate electrode of said read device.

16. The memory gain cell of claim 15 further comprising:

a conductive contact extending through said layer of said dielectric material for coupling said first capacitor plate with said first gate electrode.

17. The memory gain cell of claim 13 wherein said write device comprises:

a drain electrically coupled with said plug of said storage device;

a source;

a channel region flanked by said source and said drain of said write device; and a gate electrode electrically isolated from said channel region, said gate electrode of said write device operative for controlling a resistivity of said channel region for charging and discharging the stored charge of said storage device by transferring carriers from said source of said write device to said drain of said write device.

18. A memory circuit comprising an interconnected plurality of memory gain cells of claim 1 arranged in a memory cell array.

* * * * *